(12) United States Patent  
Camm et al.

(10) Patent No.: US 9,070,590 B2  
(45) Date of Patent: Jun. 30, 2015

(54) WORKPIECE BREAKAGE PREVENTION METHOD AND APPARATUS

(75) Inventors: David Malcolm Camm, Vancouver (CA); Joseph Cibere, Burnaby (CA); Greg Stuart, Burnaby (CA); Steve McCoy, Burnaby (CA)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 12/993,077

(22) PCT Filed: May 15, 2009

(86) PCT No.: PCT/CA2009/000681
§ 371 (c)(1),
(2), (4) Date: Apr. 1, 2011

(87) PCT Pub. No.: WO2009/137940
PCT Pub. Date: Nov. 19, 2009

(65) Prior Publication Data
US 2011/0177624 A1    Jul. 21, 2011

Related U.S. Application Data

(60) Provisional application No. 61/071,764, filed on May 16, 2008.

(51) Int. Cl.
*H01L 21/00* (2006.01)
*H01L 21/66* (2006.01)
(Continued)

(52) U.S. Cl.
CPC ............... *H01L 22/12* (2013.01); *C21D 11/00* (2013.01); *H01L 21/324* (2013.01);
(Continued)

(58) Field of Classification Search
CPC .............................. H01L 22/12; H01L 22/26
USPC .................. 438/7, 16; 257/E21.53; 219/201
See application file for complete search history.

(56) References Cited

U.S. PATENT DOCUMENTS

| 1,587,023 A | 6/1926 | Mottlau |
| RE24,296 E | 3/1957 | Stewart |

(Continued)

FOREIGN PATENT DOCUMENTS

| CA | 2339359 | 2/2000 |
| DE | 4223133 | 1/1993 |

(Continued)

OTHER PUBLICATIONS

International Search Report dated Sep. 1, 2009, for International Application No. PCT/CA2009/000681.
(Continued)

*Primary Examiner* — Kevin Parendo
(74) *Attorney, Agent, or Firm* — Knobble, Martens Olson & Bear, LLP

(57) ABSTRACT

Methods and apparatus for heat-treating a workpiece are disclosed. An illustrative method includes measuring deformation of a workpiece during heat-treating thereof, and taking an action in relation to the heat-treating of the workpiece, in response to the measuring of the deformation of the workpiece. The workpiece may include a semiconductor wafer. Taking an action may include applying a deformation correction to a temperature or reflectivity measurement of the wafer during thermal processing, or may include modifying the heat-treating of the wafer, for example.

47 Claims, 7 Drawing Sheets

(51) Int. Cl.
*C21D 11/00* (2006.01)
*H01L 21/67* (2006.01)
*H01L 21/324* (2006.01)

(52) U.S. Cl.
CPC ... *H01L 21/67098* (2013.01); *H01L 21/67115* (2013.01); *H01L 21/67248* (2013.01); *H01L 21/67253* (2013.01); *H01L 22/26* (2013.01); *H01L 2924/0002* (2013.01)

(56) References Cited

U.S. PATENT DOCUMENTS

| | | |
|---|---|---|
| 2,981,819 A | 4/1961 | Gregory |
| 3,047,438 A | 7/1962 | Marinace |
| 3,108,173 A | 10/1963 | Barrett et al. |
| 3,160,517 A | 12/1964 | Jenkin |
| 3,213,827 A | 10/1965 | Jenkin |
| 3,227,065 A | 1/1966 | Litman |
| 3,239,651 A | 3/1966 | Silberman |
| 3,240,915 A | 3/1966 | Carter et al. |
| 3,460,510 A | 8/1969 | Currin |
| 3,502,516 A | 3/1970 | Henker |
| 3,610,613 A | 10/1971 | Worden |
| 3,623,712 A | 11/1971 | McNeilly et al. |
| 3,627,590 A | 12/1971 | Mammel |
| 3,661,637 A | 5/1972 | Sirtl |
| 3,692,572 A | 9/1972 | Strehlow |
| 3,700,850 A | 10/1972 | Lumley et al. |
| 3,836,751 A | 9/1974 | Anderson |
| 3,913,872 A | 10/1975 | Weber |
| 4,027,185 A | 5/1977 | Nodwell et al. |
| 4,041,278 A | 8/1977 | Boah |
| 4,081,313 A | 3/1978 | McNeilly et al. |
| 4,097,226 A | 6/1978 | Erikson et al. |
| 4,101,759 A | 7/1978 | Anthony et al. |
| 4,115,163 A | 9/1978 | Gorina et al. |
| 4,122,240 A | 10/1978 | Banas et al. |
| 4,151,008 A | 4/1979 | Kirkpatrick |
| 4,164,643 A | 8/1979 | Peart et al. |
| 4,220,483 A | 9/1980 | Cazcarra |
| 4,224,096 A | 9/1980 | Osborne |
| 4,233,493 A | 11/1980 | Nath |
| 4,306,731 A | 12/1981 | Shaw |
| 4,308,078 A | 12/1981 | Cook |
| 4,315,130 A | 2/1982 | Inagaki et al. |
| 4,331,485 A | 5/1982 | Gat |
| 4,356,384 A | 10/1982 | Gat |
| 4,370,175 A | 1/1983 | Levatter |
| 4,375,993 A | 3/1983 | Mori et al. |
| 4,379,727 A | 4/1983 | Hansen et al. |
| 4,398,094 A | 8/1983 | Hiramoto |
| 4,421,048 A | 12/1983 | Adema et al. |
| 4,431,459 A | 2/1984 | Teng |
| 4,455,479 A | 6/1984 | Itoh et al. |
| 4,457,359 A | 7/1984 | Holden |
| 4,482,393 A | 11/1984 | Nishiyama et al. |
| 4,493,977 A | 1/1985 | Arai et al. |
| 4,504,323 A | 3/1985 | Arai et al. |
| 4,533,820 A | 8/1985 | Shimizu |
| 4,539,431 A | 9/1985 | Moddel et al. |
| 4,540,876 A | 9/1985 | McGinty |
| 4,550,245 A | 10/1985 | Arai et al. |
| 4,550,684 A | 11/1985 | Mahawili |
| 4,560,420 A | 12/1985 | Lord |
| 4,567,352 A | 1/1986 | Mimura et al. |
| 4,581,520 A | 4/1986 | Vu et al. |
| 4,636,969 A | 1/1987 | Kyoden et al. |
| 4,649,241 A | 3/1987 | Young et al. |
| 4,649,261 A | 3/1987 | Sheets |
| 4,661,177 A | 4/1987 | Powell |
| 4,682,594 A | 7/1987 | Mok |
| 4,698,486 A | 10/1987 | Sheets |
| 4,700,102 A | 10/1987 | Camm et al. |
| 4,751,193 A | 6/1988 | Myrick |
| 4,755,654 A | 7/1988 | Crowley et al. |
| 4,787,551 A | 11/1988 | Hoyt et al. |
| 4,794,619 A | 12/1988 | Tregay |
| 4,818,327 A | 4/1989 | Davis et al. |
| 4,826,269 A | 5/1989 | Streifer et al. |
| 4,851,358 A | 7/1989 | Huber |
| 4,857,689 A | 8/1989 | Lee |
| 4,857,704 A | 8/1989 | Jannot et al. |
| 4,890,245 A | 12/1989 | Yomoto et al. |
| 4,891,499 A | 1/1990 | Moslehi |
| 4,933,887 A | 6/1990 | Danko et al. |
| 4,937,490 A | 6/1990 | Camm et al. |
| 4,956,538 A | 9/1990 | Moslehi |
| 4,958,061 A | 9/1990 | Wakabayashi et al. |
| 4,959,244 A | 9/1990 | Penney et al. |
| 4,979,134 A | 12/1990 | Arima et al. |
| 4,981,815 A | 1/1991 | Kakoschke |
| 4,984,902 A | 1/1991 | Crowley et al. |
| 5,002,630 A | 3/1991 | Kermani et al. |
| 5,011,794 A | 4/1991 | Grim et al. |
| 5,041,714 A | 8/1991 | Funk |
| 5,073,698 A | 12/1991 | Stultz |
| 5,155,336 A | 10/1992 | Gronet et al. |
| 5,155,337 A | 10/1992 | Sorrell et al. |
| 5,188,458 A | 2/1993 | Thompson et al. |
| 5,196,353 A | 3/1993 | Sandhu et al. |
| 5,213,985 A | 5/1993 | Sandroff et al. |
| 5,219,786 A | 6/1993 | Noguchi |
| 5,231,595 A | 7/1993 | Makino et al. |
| 5,249,142 A | 9/1993 | Shirakawa et al. |
| 5,255,286 A | 10/1993 | Moslehi et al. |
| 5,258,824 A | 11/1993 | Carlson et al. |
| 5,271,084 A | 12/1993 | Vandenabeele et al. |
| 5,275,629 A | 1/1994 | Ajika et al. |
| 5,279,973 A | 1/1994 | Suizu |
| 5,282,017 A | 1/1994 | Kasindorf et al. |
| 5,293,216 A | 3/1994 | Moslehi |
| 5,305,417 A | 4/1994 | Najm et al. |
| 5,308,161 A | 5/1994 | Stein |
| 5,310,260 A | 5/1994 | Schietinger et al. |
| 5,313,044 A | 5/1994 | Massoud et al. |
| 5,317,429 A | 5/1994 | Mochizuki et al. |
| 5,317,656 A | 5/1994 | Moslehi et al. |
| 5,325,180 A | 6/1994 | Chappelow et al. |
| 5,326,173 A | 7/1994 | Evans et al. |
| 5,336,641 A | 8/1994 | Fair et al. |
| 5,347,128 A | 9/1994 | Puram et al. |
| 5,350,899 A | 9/1994 | Isikawa et al. |
| 5,359,693 A | 10/1994 | Nenyei et al. |
| 5,364,186 A | 11/1994 | Wang et al. |
| 5,373,135 A | 12/1994 | Beyer et al. |
| 5,387,557 A | 2/1995 | Takagi |
| 5,399,506 A | 3/1995 | Tsukamoto |
| 5,399,523 A | 3/1995 | Kakoschke |
| 5,407,485 A | 4/1995 | Takagi |
| 5,418,885 A | 5/1995 | Hauser et al. |
| 5,431,700 A | 7/1995 | Sloan |
| 5,436,172 A | 7/1995 | Moslehi |
| 5,436,443 A | 7/1995 | Abtahi |
| 5,442,727 A | 8/1995 | Fiory |
| 5,444,217 A | 8/1995 | Moore et al. |
| 5,445,676 A | 8/1995 | Takagi |
| 5,446,824 A | 8/1995 | Moslehi |
| 5,446,825 A | 8/1995 | Moslehi et al. |
| 5,460,451 A | 10/1995 | Wadman |
| 5,463,534 A | 10/1995 | Raven |
| 5,467,220 A | 11/1995 | Xu |
| 5,487,127 A | 1/1996 | Gronet et al. |
| 5,490,728 A | 2/1996 | Schietinger et al. |
| 5,501,637 A | 3/1996 | Duncan et al. |
| 5,508,934 A | 4/1996 | Moslehi et al. |
| 5,514,885 A | 5/1996 | Myrick |
| 5,517,359 A | 5/1996 | Gelbart |
| 5,530,221 A | 6/1996 | Benda et al. |
| 5,539,855 A | 7/1996 | Takahashi et al. |
| 5,553,939 A | 9/1996 | Dilhac et al. |
| 5,561,612 A | 10/1996 | Thakur |
| 5,561,735 A | 10/1996 | Camm |
| 5,568,978 A | 10/1996 | Johnson et al. |
| 5,580,388 A | 12/1996 | Moore |

(56) References Cited

U.S. PATENT DOCUMENTS

| | | | |
|---|---|---|---|
| 5,593,608 A | 1/1997 | Suzuki |
| 5,597,237 A | 1/1997 | Stein |
| 5,601,366 A | 2/1997 | Paranjpe |
| 5,603,772 A | 2/1997 | Ide |
| 5,604,592 A | 2/1997 | Kotidis et al. |
| 5,628,564 A | 5/1997 | Nenyei et al. |
| 5,635,093 A | 6/1997 | Arena et al. |
| 5,635,409 A | 6/1997 | Moslehi |
| 5,650,082 A | 7/1997 | Anderson |
| 5,654,904 A | 8/1997 | Thakur |
| 5,667,300 A | 9/1997 | Mandelis et al. |
| 5,677,240 A | 10/1997 | Murakami et al. |
| 5,683,180 A | 11/1997 | De Lyon et al. |
| 5,710,407 A | 1/1998 | Moore et al. |
| 5,715,361 A | 2/1998 | Moslehi |
| 5,727,017 A | 3/1998 | Maurer et al. |
| 5,738,165 A | 4/1998 | Imai |
| 5,738,440 A | 4/1998 | O'Neill et al. |
| 5,790,750 A | 8/1998 | Anderson |
| 5,802,099 A | 9/1998 | Curran et al. |
| 5,809,211 A | 9/1998 | Anderson et al. |
| 5,814,365 A | 9/1998 | Mahawili |
| 5,815,396 A | 9/1998 | Shimamura et al. |
| 5,822,172 A | 10/1998 | White |
| 5,830,277 A | 11/1998 | Johnsgard et al. |
| 5,841,110 A | 11/1998 | Nenyei et al. |
| RE36,050 E | 1/1999 | Thakur et al. |
| 5,858,819 A | 1/1999 | Miyasaka |
| 5,893,952 A | 4/1999 | Aronowitz et al. |
| 5,900,649 A | 5/1999 | Effelsberg |
| 5,908,307 A | 6/1999 | Talwar et al. |
| 5,937,142 A | 8/1999 | Moslehi et al. |
| 5,944,422 A | 8/1999 | Doitel et al. |
| 5,960,158 A | 9/1999 | Gat et al. |
| 5,971,565 A | 10/1999 | Zapata et al. |
| 5,993,059 A | 11/1999 | O'Neill et al. |
| 5,998,768 A | 12/1999 | Hunter et al. |
| 6,016,383 A | 1/2000 | Gronet et al. |
| 6,051,483 A | 4/2000 | Lee et al. |
| 6,056,434 A | 5/2000 | Champetier |
| 6,066,516 A | 5/2000 | Miyasaka |
| 6,108,490 A | 8/2000 | Lee et al. |
| 6,122,439 A | 9/2000 | Gronet et al. |
| 6,146,504 A | 11/2000 | Patadia et al. |
| 6,168,310 B1 | 1/2001 | Kurosaki et al. |
| 6,171,641 B1 | 1/2001 | Okamoto et al. |
| 6,183,130 B1 | 2/2001 | Adams et al. |
| 6,187,616 B1 | 2/2001 | Gyoda |
| 6,188,838 B1 | 2/2001 | Mikata et al. |
| 6,196,532 B1 | 3/2001 | Otwell |
| 6,217,212 B1 | 4/2001 | Brenninger et al. |
| 6,222,990 B1 | 4/2001 | Guardado et al. |
| 6,283,630 B1 | 9/2001 | Yazawa |
| 6,293,696 B1 | 9/2001 | Guardado |
| 6,303,411 B1 | 10/2001 | Camm et al. |
| 6,303,917 B1 | 10/2001 | Hawryluk |
| 6,315,878 B1 | 11/2001 | Patadia et al. |
| 6,348,099 B1 | 2/2002 | Xia et al. |
| 6,349,270 B1 | 2/2002 | Gurary et al. |
| 6,375,348 B1 | 4/2002 | Hebb et al. |
| 6,376,806 B2 | 4/2002 | Yoo |
| 6,406,545 B2 | 6/2002 | Shoda et al. |
| 6,452,671 B1 * | 9/2002 | Uda et al. ............ 356/237.2 |
| 6,494,371 B1 | 12/2002 | Rekow et al. |
| 6,505,621 B2 | 1/2003 | Gabelmann |
| 6,522,390 B2 | 2/2003 | Suzuki et al. |
| 6,529,686 B2 | 3/2003 | Ramanan et al. |
| 6,530,687 B1 | 3/2003 | Suzuki et al. |
| 6,531,681 B1 | 3/2003 | Markle et al. |
| 6,534,752 B2 | 3/2003 | Camm et al. |
| 6,536,131 B2 | 3/2003 | Davis |
| 6,541,287 B2 | 4/2003 | Ino et al. |
| 6,561,796 B1 | 5/2003 | Barrerra et al. |
| 6,564,166 B1 * | 5/2003 | Ume et al. ............ 702/136 |
| 6,592,252 B2 | 7/2003 | Baba |
| 6,594,446 B2 | 7/2003 | Camm et al. |
| 6,608,967 B1 | 8/2003 | Arrison |
| 6,609,909 B2 | 8/2003 | Aoki et al. |
| 6,610,968 B1 | 8/2003 | Shajii et al. |
| 6,613,685 B1 | 9/2003 | Granneman et al. |
| 6,621,199 B1 | 9/2003 | Parfeniuk et al. |
| 6,634,882 B2 | 10/2003 | Goodman |
| 6,645,356 B1 | 11/2003 | Woodruff et al. |
| 6,669,783 B2 | 12/2003 | Sexton et al. |
| 6,702,302 B2 | 3/2004 | Smedt et al. |
| 6,752,625 B1 | 6/2004 | Aschner et al. |
| 6,798,142 B2 | 9/2004 | Eguchi |
| 6,849,831 B2 | 2/2005 | Timans et al. |
| 6,855,916 B1 | 2/2005 | Matthews et al. |
| 6,859,616 B2 | 2/2005 | Kusuda et al. |
| 6,885,815 B2 | 4/2005 | Kusuda et al. |
| 6,887,317 B2 | 5/2005 | Or et al. |
| 6,897,130 B2 | 5/2005 | Miyauchi et al. |
| 6,938,649 B2 | 9/2005 | Nakazawa |
| 6,941,063 B2 | 9/2005 | Camm et al. |
| 6,953,338 B2 | 10/2005 | Kreiser et al. |
| 6,963,692 B2 | 11/2005 | Camm et al. |
| 6,970,644 B2 | 11/2005 | Koren et al. |
| 6,987,240 B2 | 1/2006 | Jennings et al. |
| 6,998,580 B2 | 2/2006 | Kusuda et al. |
| 7,002,363 B2 | 2/2006 | Mathieu |
| 7,005,601 B2 | 2/2006 | Jennings |
| 7,070,660 B2 | 7/2006 | Keeton et al. |
| 7,143,005 B2 | 11/2006 | Dahlen et al. |
| 7,184,657 B1 | 2/2007 | Camm et al. |
| 7,616,872 B2 | 11/2009 | Camm et al. |
| 7,700,467 B2 | 4/2010 | Bu et al. |
| 7,955,074 B2 | 6/2011 | Jin et al. |
| 8,073,316 B2 | 12/2011 | Nakagawa |
| 8,138,456 B2 | 3/2012 | Fukuda et al. |
| 8,242,417 B2 | 8/2012 | Tadokoro et al. |
| 2001/0013684 A1 | 8/2001 | Smedt et al. |
| 2002/0000547 A1 | 1/2002 | Yamaguchi |
| 2002/0012109 A1 * | 1/2002 | Suzuki et al. ............ 355/53 |
| 2002/0066859 A1 | 6/2002 | Ino et al. |
| 2002/0080850 A1 | 6/2002 | Baba |
| 2002/0102098 A1 | 8/2002 | Camm et al. |
| 2003/0022402 A1 * | 1/2003 | Takano ............ 438/14 |
| 2003/0081945 A1 | 5/2003 | Kusuda |
| 2003/0183613 A1 * | 10/2003 | Takano ............ 219/390 |
| 2003/0196993 A1 | 10/2003 | Jennings |
| 2004/0105670 A1 | 6/2004 | Kusuda et al. |
| 2004/0178553 A1 | 9/2004 | Camm et al. |
| 2005/0018196 A1 | 1/2005 | Kusuda |
| 2005/0043917 A1 * | 2/2005 | Dahlen et al. ............ 702/168 |
| 2005/0062388 A1 | 3/2005 | Camm et al. |
| 2005/0063448 A1 | 3/2005 | Kusuda |
| 2005/0063453 A1 | 3/2005 | Camm et al. |
| 2005/0133167 A1 | 6/2005 | Camm et al. |
| 2005/0179354 A1 | 8/2005 | Camm et al. |
| 2005/0284371 A1 | 12/2005 | McFadden et al. |
| 2006/0096677 A1 | 5/2006 | Camm et al. |
| 2006/0201927 A1 | 9/2006 | Gat et al. |
| 2006/0228897 A1 | 10/2006 | Timans |
| 2006/0291835 A1 | 12/2006 | Nozaki et al. |
| 2007/0069161 A1 | 3/2007 | Camm et al. |
| 2007/0257085 A1 * | 11/2007 | Fukuda et al. ............ 228/101 |
| 2007/0272680 A1 * | 11/2007 | Tadokoro et al. ............ 219/494 |
| 2008/0157452 A1 | 7/2008 | Camm et al. |
| 2008/0299784 A1 * | 12/2008 | Jin et al. ............ 438/799 |
| 2009/0098665 A1 * | 4/2009 | Bu et al. ............ 438/7 |
| 2009/0196588 A1 * | 8/2009 | Nakagawa ............ 392/416 |

FOREIGN PATENT DOCUMENTS

| | | |
|---|---|---|
| EP | 0399662 | 11/1990 |
| EP | 0446425 A1 | 9/1991 |
| EP | 0538874 | 4/1993 |
| EP | 0576791 | 1/1994 |
| EP | 0598409 | 5/1994 |
| EP | 0669640 A1 | 8/1995 |
| EP | 0840360 | 5/1998 |
| EP | 0942268 | 9/1999 |
| EP | 1073096 | 1/2001 |

(56) References Cited

FOREIGN PATENT DOCUMENTS

| | | |
|---|---|---|
| EP | 1557868 A1 | 7/2005 |
| GB | 938699 | 10/1963 |
| GB | 2065973 | 7/1981 |
| JP | 55-115327 | 9/1980 |
| JP | 56-048128 | 5/1981 |
| JP | 57-80729 | 5/1982 |
| JP | 57-208146 | 12/1982 |
| JP | 58-070536 | 4/1983 |
| JP | 58-106836 | 6/1983 |
| JP | 59-211221 | 11/1984 |
| JP | 01-246828 | 10/1989 |
| JP | 01-268120 | 10/1989 |
| JP | 02-294027 | 12/1990 |
| JP | 04-355911 | 12/1992 |
| JP | 5-295543 | 11/1993 |
| JP | 06-318558 | 11/1994 |
| JP | 07-058040 | 3/1995 |
| JP | 07-058041 | 3/1995 |
| JP | 07-245274 | 9/1995 |
| JP | 08-45922 A | 2/1996 |
| JP | 8-55898 A | 2/1996 |
| JP | 08-107113 | 4/1996 |
| JP | 08-261967 | 10/1996 |
| JP | 09-126913 A | 5/1997 |
| JP | 09/293684 | 11/1997 |
| JP | 10-050629 | 2/1998 |
| JP | 10-110977 | 4/1998 |
| JP | 11-097371 | 4/1999 |
| JP | 11-316159 | 11/1999 |
| JP | 2000-058534 | 2/2000 |
| JP | 2000-323487 | 11/2000 |
| JP | 2001-126995 | 5/2001 |
| JP | 2001-522142 A | 11/2001 |
| JP | 2001-524749 | 12/2001 |
| JP | 2003-525524 | 8/2003 |
| JP | 2004-179510 | 6/2004 |
| JP | 2004-186542 | 7/2004 |
| JP | 2004-247339 | 9/2004 |
| JP | 2005-101215 | 4/2005 |
| JP | 2005-116812 | 4/2005 |
| JP | 2006-170616 | 6/2006 |
| JP | 2006-278806 | 10/2006 |
| JP | 2006-351871 A | 12/2006 |
| KR | 1999-0020323 | 6/1999 |
| NO | 32864 | 8/1921 |
| TW | 465000 | 11/2001 |
| TW | 526580 | 4/2003 |
| TW | 556283 | 10/2003 |
| WO | WO 87/05054 | 8/1987 |
| WO | WO 91/10873 | 7/1991 |
| WO | WO 94/01982 | 1/1994 |
| WO | WO 99/23691 A2 | 5/1999 |
| WO | WO 99/41777 | 8/1999 |
| WO | WO 99/58733 | 11/1999 |
| WO | WO 99/60184 | 11/1999 |
| WO | WO 00/58700 | 5/2000 |
| WO | WO 00/67298 | 11/2000 |
| WO | WO 01/56064 | 8/2001 |
| WO | WO 02/47123 | 6/2002 |
| WO | WO 02/47143 | 6/2002 |
| WO | WO 02/075264 | 9/2002 |
| WO | WO 03/060447 | 7/2003 |
| WO | WO 2004/057650 | 7/2004 |
| WO | WO 2005/029014 | 3/2005 |
| WO | WO 2005/059991 | 6/2005 |
| WO | WO 2005/078762 | 8/2005 |
| WO | WO 2008/058397 | 5/2008 |

OTHER PUBLICATIONS

Search Report completed Nov. 15, 2011 and issued to Taiwanese patent application 093139109.
International Preliminary Report on Patentability for PCT/CA2004/002155, mailed Jun. 29, 2006.
International Search Report and Written Opinion for International Application No. PCT/CA2007/002070 (publication No. WO 2008/058397), mailed on Mar. 6, 2008.
International Search Report for International Application No. PCT/CA02/01987, mailed on Jun. 10, 2003.
Blake, et al. "Slip Free Rapid Thermal Processing." Mat. Res. Soc. Symp. Proc., vol. 92, pp. 265-272, 1987.
Bomke, et al. "Annealing of Ion-implanted Silicon by an Incoherent Light Pulse," Appl. Phys. Lett., vol. 33, No. 11, pp. 955-957, Dec. 1, 1978.
British Stainless Steel Association, "Maximum service temperatures in air for stainless steels", author unknown, published at http://www.bssa.org.ukitopics.php?articie=42, as of Sep. 13, 2010, earliest publication date unknown.
British Stainless Steel Association, "Melting temperature ranges for stainless steels", author unknown, published at http://www.bssa.org.ukitopics.php?articie=103, as of Sep. 13, 2010, earliest publication date unknown.
Burggraaf, "Rapid Wafer Heating: Status 1983," Semiconductor International, pp. 69-74, Dec. 1983.
Camm, et al. "2D Real Time Temperature measurements in a New Short Wavelength Arc Lamp RTP Chamber for Improved Uniformity," Proc. 3rd Int. RTP Conf, RTP'95 p. 241 (Round Rock Texas), 1995.
Camm, et al. "Engineering Ultra-shallow Junctions Using fRTP™," 10th IEEE International Conference on Advanced Thermal Processing of Semiconductors—RTP 2002, pp. 5-10, 2002.
Camm, et al. "High Power Arc Lamp RTP System for High Temperature Annealing Applications," Proc. 2nd Int. RTP Conf, RTP'94, p. 259 (Round Rock Texas), 1994.
Camm, et al. "Spike Thermal Processing Using Arc Lamps," Advances in Rapid Thermal Processing, 2000.
Celler, et al. "Drift of Arsenic in SiO2 in a Lamp Furnace with a Built-in Temperature Gradient," Mat. Res. Soc. Symp. Proc., vol. 92, pp. 53-58, 1987.
Chen, et al. "The use of a Kaleidoscope to Obtain Uniform Flux Over a Large Area in a Solar or Arc Imaging Furnace," Applied Optics, vol. 2, No. 3, pp. 265-271, Mar. 1963.
Cibere, et al. "Flash Thermal Processing Through the Melting Point of Silicon," 11th IEEE International Conference on Advanced Thermal Processing of Semiconductors—RTP 2003.
Cohen, et al. Thermally Assisted Flash Annealing of Silicon and Germanium, Appl. Phys. Lett., vol. 33, No. 8, pp. 751-753, Oct. 1978.
Current, et al. "Ion Implantation and rapid Annealing of 125 mm Wafers," Solid State Technology, pp. 197-202, Oct. 1983.
Dilhac, et al. "Adaptive Process control for a Rapid Thermal Processor," SPIE, vol. 1393, Rapid Thermal and Related Processing Techniques, pp. 395-403, 1990.
Dilhac, et al. "Thermal Model for Rapid Thermal Processors: Theory and Applications," RTP'93 Conference Proceedings, pp. 12-18, 1993.
Fair, "Rapid Thermal Processing—A Justification," In Fair, R.B. ed., Rapid Thermal Processing: Science and Technology (Boston: Academic Press, Inc.) pp. 1-11, 1993.
Fan, et al. "Transient Heating with Graphite Heaters for Semiconductor Processing," in Appleton B.R., et al., ed, Laser and Electron-Beam Interactions with Solids: Proceedings of the Materials Research Society Annual Meeting, Nov. 1981, Boston (New York: North Holland, Elsevier, 1982), pp. 751-758.
Fiory, et al. "Annealing Ultra-low Energy Boron Implants with an Arc lamp System," RTP 1999, pp. 273-280, 1999.
Fiory, et al. "Electrical Measurements of Annealed Boron Implants for Shallow Junctions," Advances in Rapid Thermal Processing, vol. 99-10, pp. 133-140, 1999.
Fiory, et al. "Spike Annealing of Implanted PMOS Gates," Proc. of RTP 2000 Conference, pp. 1-8, Sep. 20-22, 2000.
Gat, et al. "Introduction to Heatpulse™ Processing Technology," AG Associates, Mountain View, CA, pp. 1-29.
Gelpey, et al. "Advanced Annealing for Sub-130nm Junction Formation," 201st Electrochemical Society Meeting, Symposium Q1, Rapid Thermal and Other Short-time Processing Technologies III, May 12-17, 2002, paper 735, May 2002.
Gelpey, et al. "Process Control for a Rapid Optical Annealing System," Mat. Res. Soc. Symp. Press, vol. 52, 1986.

(56) References Cited

OTHER PUBLICATIONS

Gelpey, et al. "Rapid Optical Annealing Using the Water-wall DC Arc Lamp," Microelectronic Manufacturing and Testing, pp. 22-24, Aug. 1983.
Habermehl, et al. "Properties of Residual Stress Silicon Oxynitrides used as a Sacrificial layer," VLSI Conference, Jan. 4-8, 2000.
Hill, et al. "Rapid Thermal Annealing—Theory and Practice," in Levy, R.A. ed., Reduced Thermal Processing for ULSI (New York: Plenum, 1989), pp. 143-180.
Hirscher, "Electrostatic Chuck to Boost your Yield," Unaxis Wafer Processing, Chip Online, Issue No. 5, pp. 39-43, undated.
Kakoschke, "Is There a Way to a Perfect Rapid Thermal Processing System?" Mat. Res. Soc. Symp. Proc., vol. 224, pp. 159-170, 1991.
Kakoschke, et al. "Simulation of Temperature Effects during Rapid Thermal Processing," Mat. Res. Soc. Symp. Proc., vol. 146, pp. 473-482, 1989.
Kapany, et al. "Fiber Optics. Part II. Image Transfer on Static and Dynamic Scanning with Fiber Bundles," Journal of the Optical Society of America, vol. 47, No. 5, pp. 423-427, May 1957.
Klabes, et al. "Pulsed Incoherent Light Annealing of Arsenic and Phosphorus Implanted Polycrystalline Silicon," Physica Status Solidi, pp. K5-7, K9-12, 1982.
Lefrancois, et al. "Emissivity Independent Process Control in a Short Wavelength Arc Lamp RTP Chamber," in MRS Symposium Proceedings, vol. 429, Rapid Thermal and Integrated Processing V, p. 321, Pittsburgh, 1996.
Lefrancois, et al. "Temperature Uniformity During Impulse™ Anneal," 8th International Conference on Advanced Thermal Processing of Semiconductors, RTP 2000, pp. 1-6, Sep. 20-22, 2000.
Lietoila, et al. "Temperature Rise Induced in Si by Continuous Xenon Arc Lamp Radiation," American Institute of Physics, vol. 53, No. 2, pp. 1169-1172, Feb. 1982.
Lischner, et al. "Rapid Large Area Annealing of Ion-Implanted Si with Incoherent Light," in Appleton B.R. et al., ed., Laser and Electron-Beam Interactions with Solids: Proceedings of the Materials Research Society Annual Meeting, Nov. 1981, Boston (New York: North Holland/Elsevier, 1982) pp. 759-764.
Lojek. "Issues in Manufacturing Unique Silicon Devices using Rapid Thermal Annealing," in Fair, R.B. ed., Rapid Thermal Processing: Science and Technology, (Boston: D61 Academic Press, Inc.), pp. 311-347, 1993.
Lord, "Thermal and Stress Analysis of Semiconductor Wafers in a Rapid Thermal Processing Oven," IEEE Transactions on Semiconductor Manufacturing, vol. 1, No. 3, pp. 105-114, Aug. 1988.
Lue, "Arc Annealing of BF+2 Implanted Silicon by a Short Pulse Flash Lamp," Appl. Phys. Lett., vol. 36, No. 1, pp. 73-76, Jan. 1, 1980.
Myer, "Zoomable Kaleidoscopic Mirror Tunnel," Applied Optics, vol. 10, No. 9, pp. 2179-2182, Sep. 1971.
Nishiyama, et al. "Radiation Annealing of Boron-implanted Silicon with a Halogen Lamp," Japanese Journal of Applied Physics, vol. 19, No. 10, pp. L563-L566, Oct. 1980.
Notice of Allowance mailed Sep. 29, 2008 in connection with commonly owned U.S. Appl. No. 11/018,388.
Nulman, et al. "Pyrometric Emissivity Measurements and Compensation in an RTP Chamber," Mat. Res. Soc. Symp. Proc., vol. 146, pp. 461-466 (1989).
Office Action mailed May 19, 2006 in connection with commonly owned U.S. Appl. No. 10/497,447.
Office Action mailed Aug. 21, 2006 in connection with commonly owned U.S. Appl. No. 10/497,447.
Office Action mailed Feb. 21, 2007 in connection with commonly owned U.S. Appl. No. 10/497,447.
Office Action mailed Oct. 25, 2006 in connection with commonly owned U.S. Appl. No. 11/018,388.
Office Action mailed Jun. 9, 2006 in connection with commonly owned U.S. Appl. No. 11/018,388.
Office Action mailed Mar. 30, 2007 in connection with commonly owned U.S. Appl. No. 11/018,388.
Office Action mailed Oct. 16, 2007 in connection with commonly owned U.S. Appl. No. 11/018,388.
Office Action mailed Mar. 18, 2008 in connection with commonly owned U.S. Appl. No. 11/018,388.
Office Action mailed Aug. 12, 2008 in connection with commonly owned U.S. Appl. No. 11/302,600.
Potter, "Transmission Properties of Optical Fibers," Journal of the Optical Society of America, vol. 51, No. 10, pp. 1079-1089, Oct. 1961.
Powell, et al. "Activation of Arsenic-implanted Silicon Using an Incoherent Light Source," Appl. Phys. Lett., vol. 39, No. 2, pp. 150-152, Jul. 15, 1981.
Powell, et al. "Annealing of Implantation Damage in Integrated-circuit Devices using an Incoherent Light Source," J. Vac. Sci. Technol., vol. 20, No. 1, pp. 32-36, Jan. 1982.
Riccardi, et al. "The Adaptive Secondary Mirror for the 6.5m Conversion of the Multiple Mirror Telescope," Beyond Conventional Adaptive Optics, 10 pages, Venice, 2001.
Roozeboom, "Manufacturing Equipment Issues in rapid Thermal Processing," in Fair, R.B., ed. Rapid Thermal Processing: Science and Technology (Boston: Academic Press, Inc.,) pp. 349-423, 1993.
Ross, et al. "Characterizing Implant Behavior During Flash RTP by Means of Backside Diagnostics," 10th IEEE International Conference on Advanced Thermal Processing of Semiconductors—RTP 2002, pp. 99-105 (2002).
Sedgwick, "Short Time Annealing," J. Electrochem. Soc., vol. 130, No. 2, pp. 484-492, Feb. 1983.
Semco Engineering, "Smart Solutions for . . . Single Wafer Clamping," as available from http://www.semcoeng.com/Pilot01/Rubrique/Index.php3?IdTheme=6&IdPage=24 on Jul. 11, 2006 (undated).
Semiconductor Industry Association, "International Technology Roadmap for Semiconductors, "International Sematech, Austin Texas, pp. 7, 14, 123-131, 1999.
Service Support Specialties, "Hot Plates," as available from http://www.s-cubed.com/pdf/StandAloneHP.pdf on Jul. 11, 2006.
Sheets, "Automatic Cassette to Cassette Radiant Impulse Processor," Nuclear Instruments and Methods in Physics Research, Amsterdam, North Holland, Elsevier Science Publishers B.V. pp. 219-223, 1985.
Stuart, et al. "Temperature Diagnostics for a Dual-Arc FRTP Tool," 10th IEEE International Conference on Advanced Thermal Processing of Semiconductors—RTP 2002, pp. 77-82, 2002.
Sumitomo Osaka Cement Co., Ltd., Advanced materials Research Division, Characteristics of fine Al2-O3-SiC Composite ESC, Technical Report, 1999.
Tamarack Scientific Company, "Transient Calorimeter Calibration System" Technical Report AFFDL-TR-75-24, Orange, California, pp. 1-50, Mar. 1975.
Tichy, et al. "Annealing of Ultra-shallow Implanted Junctions Using Arc-lamp Technology: Achieving the 90 nm Node," 9th IEEE International Conference on Advanced Thermal Processing of Semiconductors—RTP 2001, Sep. 2001.
Tillmann, et al. "Processing of 200 and 300 mm Wafers in an Advanced Rapid Thermal Processing System" Proc. RTP 1998, 6th International Conference on Advanced Thermal Processing of Semiconductors, Kyoto, Japan, 1998, pp. 62-63, 1998.
Vandenabeele, et al. "Impact of Patterned Layers on Temperature Non-uniformity During Rapid Thermal Processing for VLSI-Applications," Mat. Res. Soc. Symp. Proc., vol. 146, pp. 149-160, 1989.
Varian, Extrion Division Semiconductor Equipment Group, "RTP-800 Rapid Thermal Processor," pp. 1-6, Dec. 1985.
von Gutfeld, "Crystallization of Silicon for Solar Cell Applications," IBM Technical Disclosure, vol. 19, IBM Corp., pp. 3955-3956 Mar. 1977.
Williamson, "Cone Channel Condenser Optics," Journal of the Optical Society of America, vol. 42, No. 10, pp. 712-715, Oct. 1952.
Wilson, et al. "An Overview and Comparison of Rapid Thermal Processing Equipment: A User's Viewpoint," Mat. Res. Soc. Symp. Proc., vol. 52, pp. 181-190, 1986.
Xu et al. "Measurement of Solid-Liquid Interface Temperature During Pulsed Excimer Laser Melting of Polycrystalline Silicon Films," Applied Physical Letters, vol. 65, No. 14, pp. 1745-1747, Oct. 3, 1994.

* cited by examiner

WORKPIECE BREAKAGE PREVENTION METHOD AND APPARATUS

CROSS-REFERENCE TO RELATED APPLICATIONS

This application is a U.S. National Phase of International Application No. PCT/CA2009/000681, filed May 15, 2009, designating the U.S. and published in English as WO 2009/137940 on Nov. 19, 2009 which claims the benefit of U.S. Provisional Patent Application No. 61/071,764 filed May 16, 2008.

FIELD OF THE INVENTION

The present invention relates to methods and apparatus for heat-treating a workpiece, such as a semiconductor wafer, for example.

BACKGROUND

Numerous applications involve heat-treating a workpiece. For example, in the manufacture of semiconductor chips such as microprocessors, the workpiece typically includes a semiconductor wafer, supported in a thermal processing chamber for annealing or other heat-treating purposes. Commonly owned U.S. Pat. No. 7,501,607, which is hereby incorporated herein by reference, discusses examples of heat-treating techniques for annealing such semiconductor wafers, in which the wafer is first pre-heated to an intermediate temperature, following which the top or device side surface is rapidly heated to an annealing temperature. The initial pre-heating stage occurs at a rate significantly slower than a thermal conduction time through the wafer, and may be achieved by irradiating the back-side or substrate side of the wafer with an arc lamp or other irradiance device, to heat the wafer at a ramp rate less than 400° C. per second, for example. The subsequent surface heating stage occurs much more rapidly than the thermal conduction time through the wafer, so that only the device side surface is heated to the final annealing temperature, while the bulk of the wafer remains close to the cooler intermediate temperature. Such surface heating may be achieved by exposing the device-side surface to a high-power irradiance flash from a flash lamp or bank of flash lamps, the flash having a relatively short duration, such as one millisecond, for example. The cooler bulk of the wafer then acts as a heat sink to facilitate rapid cooling of the device side surface.

Such annealing methods, which involve rapidly heating the device side of the wafer to a substantially higher temperature than the bulk of the wafer, tend to cause the device side to thermally expand at a greater rate than the rest of the wafer. Depending on the magnitude of the temperature difference between the device side temperature and the temperature of the bulk of the wafer, this may tend to cause "thermal bowing", whereby the normally planar wafer deforms itself into a thermally deformed shape. Depending on the magnitude and rapidity of the device side heating stage, the thermally deformed shape may have attributes of a dome shape, with the center of the wafer tending to rapidly rise relative to its edge regions. The thermal bowing may also cause the outer perimeter or edge of the workpiece (such as the outer two or four centimeters of a 30-cm diameter wafer, for example) to curl downward steeply, and thus, the thermally deformed shape may also have attributes of a saucer shape similar to a FRISBEE™ flying disc. The thermally deformed shape represents a reduced stress configuration of the wafer, lowering the thermal stress resulting from the temperature gradient between the device side and the bulk of the wafer.

Due to the extreme rapidity at which the device side of the wafer is heated (in the course of a 1-millisecond flash, for example, much faster than a typical thermal conduction time in the wafer), the deformation of the wafer may occur sufficiently rapidly that the edges of the wafer tend to move rapidly downward. If the wafer is supported by conventional support pins near its edges, the thermal bowing of the wafer may apply large downward forces to the support pins, potentially damaging or destroying both the pins and the wafer. Such forces may also cause the wafer to launch itself vertically upward from the support pins, which may result in further damage to the wafer as the wafer falls back down and strikes the pins. If the wafer is supported by support pins located further radially inward, the edges of the wafer may rapidly bow downward and strike a support plate above which the wafer is supported, potentially damaging or destroying the wafer. In addition, due to the rapidity at which such thermal bowing occurs, the initial velocities imparted to the various regions of the wafer tend to cause the wafer to overshoot the equilibrium minimum stress shape and rapidly oscillate or vibrate, resulting in additional stress and potentially damaging or destroying the wafer.

SUMMARY OF THE INVENTION

In addition to the rapid thermal deformation of a semiconductor wafer that may result from an irradiance flash, semiconductor wafers may also be thermally deformed in other circumstances during heat-treating.

For example, if a thermal gradient exists through the thickness of the wafer during the comparatively slower pre-heating stage, (for example, as a result of irradiating only one side of the wafer, or irradiating both sides with unequal powers), the hotter side of the wafer thermally expands more than the cooler side, thereby tending to cause the wafer to deform into a dome shape, with the hotter side on the outside surface of the dome.

As a further example, if a film has been applied to one surface of a wafer, it is possible that the film may have a different Coefficient of Thermal Expansion (CTE) than the material on the opposite side of the wafer (which may be the wafer substrate, or a different film applied to the opposite side). This may also tend to produce thermal deformation of the wafer.

The present inventors have identified a number of effects of such deformation upon a semiconductor wafer or other workpiece during heat-treating. For example, the present inventors have observed that measurements of electromagnetic radiation emitted or reflected by a surface of the wafer may be susceptible to measurement errors caused by the deformation of the wafer. For example, if reflectivity of a surface of the wafer is being measured, the intensity of illuminating radiation reflected by the wafer and received at a detector will change as the wafer thermally deforms from a planar shape to a dome shape, due to the magnification or spherical lensing effect associated with the thermally deformed dome shape of the wafer, thereby introducing a source of measurement error. If such a reflectivity measurement is being used to produce an emissivity-compensated temperature measurement, such a temperature measurement will also suffer from such measurement errors.

As another example of an effect of thermal deformation upon heat-treating, commonly owned United States Patent Application Publication No. US 2004/0178553, which is hereby incorporated herein by reference, discloses an embodiment in which the device side of the wafer is heated to the desired annealing temperature by two successive flashes rather than by a single irradiance flash. The initial irradiance flash thermally deforms the wafer into a dome shape, with the center of the device side being closer to the flash lamps than the outer perimeter of the wafer. The second irradiance flash is timed to strike the device side when it has thermally deformed into such a dome shape, before it begins to return toward its equilibrium shape. Such an embodiment allows the device side to reach the desired annealing temperature with a lower likelihood of wafer damage or breakage than if the device side had been heated to the annealing temperature by exposing the wafer to only a single irradiance flash while in a generally planar shape. The present inventors have also found that such pre-deforming of the wafer into a dome shape with the center of the device side closer to the flash lamps than the perimeter of the wafer, prior to flash-heating the device side to the annealing temperature, also results in a lower likelihood of damage or breakage than if the wafer had been pre-deformed in the opposite direction, with the center of the wafer being further away from the flash lamps than the outer perimeter of the wafer at the commencement of the annealing flash. Thus, the present inventors have found that thermal deformation of the wafer into a dome shape, with the center of the wafer closer to the flash lamps, may be advantageous in certain circumstances, particularly as a preliminary step in preparing the wafer to receive a high-power irradiance flash. (For ease of terminology, such a dome shape, with the center of the wafer vertically elevated above the outer perimeter of the wafer, is referred to herein as a "positive dome" or "positive curvature" dome shape. Conversely, a dome shape with the outer perimeter of the wafer being vertically elevated above the center of the wafer is referred to herein as a "negative dome" or "negative curvature" dome shape.)

Conversely, however, the present inventors have also found that the same type of "positive curvature" thermal deformation may be disadvantageous, depending upon its magnitude and upon the physical parameters of the heat-treating system. For example, U.S. Pat. No. 7,501,607 discloses that thermal deformation of the wafer may lead to undesirable temperature non-uniformities and thermal runaway, potentially resulting in wafer damage or breakage. In this example, if the wafer is pre-heated in a manner that the device side is excessively hotter than the backside of the wafer (for example, by irradiating the device side to pre-heat the wafer), then the resulting thermal bowing would tend to occur in the "positive" direction as defined herein, with the central region of the wafer moving slightly upward and away from a support plate above which the wafer is supported, and the outer edges of the wafer moving closer to the support plate. As the outer edges of the backside of the wafer move closer to the support plate under such thermal bowing, the rate of conduction of heat from the outer edges of the back-side to the support plate increases, with the result that the temperature difference between the device side and the back-side becomes even greater, causing further aggravation of the thermal bowing effect. In addition, the outer edges tend to shrink as they cool relative to the remainder of the wafer, which in turn forces the hot expanded center of the wafer to thermally bow even further. Thus, the more the wafer bows, the greater the conduction from the edges of the wafer to the support plate, which in turn causes further bowing and even greater conductive heat losses at the edges. In this scenario, thermal runaway can occur, and may result in undesirably large temperature gradients in the wafer. These non-uniformities may damage or even break the wafer, depending on their magnitude. In addition to a pre-heating stage, such thermal coupling and thermal runaway effects may also occur during a subsequent cooling stage following an irradiance flash.

Thus, the same general type of "positive" curvature deformation of the wafer, which may be advantageous for reducing the likelihood of breakage resulting from an irradiance flash, may also be disadvantageous in causing undesirable thermal gradients and potentially thermal runaway, depending upon the magnitude of the curvature and other parameters of the heat-treating system.

In accordance with an illustrative embodiment of the invention, there is provided a method including measuring deformation of a workpiece during heat-treating thereof, and taking an action in relation to the heat-treating of the workpiece, in response to the measuring of the deformation of the workpiece. Advantageously, by measuring the deformation of the workpiece during heat-treating, actions may be taken to enhance or modify the heat-treating process, as appropriate.

The workpiece may include a semiconductor wafer, and measuring deformation of the workpiece may include measuring deformation during thermal processing of the wafer.

Taking an action may include applying a deformation correction to a temperature measurement of the wafer during the thermal processing. Applying may include applying the deformation correction to a reflectivity measurement used to obtain the temperature measurement. Advantageously, such a method permits compensation for measurement errors introduced by the thermal deformation of the workpiece.

Taking an action may include modifying the thermal processing of the wafer.

For example, modifying the thermal processing may include initiating an irradiance flash incident upon a surface of the wafer in response to measuring a desired deformation of the wafer. Advantageously, therefore, the likelihood of wafer damage or breakage resulting from the flash may be reduced by measuring the deformation of the wafer and initiating the irradiance flash when the wafer's shape is in the desired deformed state, which may be a positive dome shape in a predefined curvature range, for example.

Modifying may include counteracting thermal runaway in the wafer. Modifying may include increasing a spacing between the wafer and a support plate therebeneath. Modifying may include reducing a deformation of the wafer relative to its initial shape. Modifying may include supplying additional heat to a surface of the wafer. Modifying may include aborting the thermal processing of the wafer.

Measuring deformation may include measuring curvature of the wafer. Measuring curvature may include measuring a radius of curvature when the wafer has deformed to a dome shape.

Measuring curvature may include measuring a change in an image reflected by the wafer. For example, measuring the change in the image may include measuring a change in a magnification of the image reflected by the wafer. Alternatively, or in addition, measuring the change in the image may include identifying at least two normals to a surface of the wafer.

Taking an action may include inducing a desired deformation of the wafer. Inducing may include causing the wafer to deform to a dome shape. For example, inducing may include causing the wafer to deform to a dome shape in which a center of the wafer is closer to an irradiance flash source than an outer perimeter of the wafer. Causing may include irradiating a surface of the wafer to cause the surface to thermally expand. Causing may include selectively irradiating opposing surfaces of the wafer. Causing may include irradiating a wafer having at least one film-coated surface.

The method may further include initiating an irradiance flash incident upon a surface of the wafer when the desired deformation of the wafer has been induced.

In accordance with another illustrative embodiment of the invention, there is provided an apparatus for heat-treating a workpiece. The apparatus includes a heat-treating system configured to heat-treat the workpiece, and a measuring system configured to measure deformation of the workpiece during heat-treating of the workpiece by the heat-treating system. The apparatus further includes a processor circuit configured to cooperate with the heat-treating system and the measuring system to cause an action to be taken in relation to the heat-treating of the workpiece, in response to the measuring system measuring the deformation of the workpiece.

The workpiece may include a semiconductor wafer, and the heat-treating system may include a thermal processing system.

The processor circuit may be configured to apply a deformation correction to a temperature measurement of the wafer during the thermal processing. The processor circuit may be configured to apply the deformation correction to a reflectivity measurement used to obtain the temperature measurement.

The processor circuit may be configured to modify the thermal processing of the wafer in response to the measuring system measuring the deformation of the wafer.

The heat-treating system may include an irradiance flash source and the processor circuit may be configured to control the heat-treating system to initiate an irradiance flash incident upon a surface of the wafer in response to the measuring system measuring a desired deformation of the wafer.

The processor circuit may be configured to control the heat-treating system to counteract thermal runaway in the wafer. The processor circuit may be configured to control the heat-treating system to increase a spacing between the wafer and a support plate therebeneath. The processor circuit may be configured to control the heat-treating system to reduce a deformation of the wafer relative to its initial shape. The processor circuit may be configured to control the heat-treating system to supply additional heat to a surface of the wafer. The processor circuit may be configured to control the heat-treating system to abort the thermal processing of the wafer.

The measuring system may be configured to measure curvature of the wafer. The measuring system may be configured to measure a radius of curvature when the wafer has deformed to a dome shape. The measuring system may be configured to measure a change in an image reflected by the wafer. For example, the measuring system may be configured to measure a change in a magnification of the image reflected by the wafer. The measuring system may include an image source and a detector configured to detect a reflection of the image source by a surface of the wafer. The detector may include a camera, for example. Alternatively, or in addition, the measuring system may be configured to identify at least two normals to a surface of the wafer.

The processor circuit may be configured to control the heat-treating system to induce a desired deformation of the wafer. For example, the processor circuit may be configured to control the heat-treating system to cause the wafer to deform to a dome shape. The dome shape may be a dome shape in which a center of the wafer is closer to an irradiance flash source than an outer perimeter of the wafer, for example.

The processor circuit may be configured to control the heat-treating system to irradiate a surface of the wafer to cause the surface to thermally expand. The processor circuit may be configured to control the heat-treating system to selectively irradiate opposing surfaces of the wafer. The processor circuit may be configured to control the heat-treating system to irradiate a wafer having at least one film-coated surface.

The processor circuit may be configured to control the heat-treating system to initiate an irradiance flash incident upon a surface of the wafer when the desired deformation of the wafer has been induced.

In accordance with another illustrative embodiment of the invention, there is provided an apparatus including means for measuring deformation of a workpiece during heat-treating thereof, and means for taking an action in relation to the heat-treating of the workpiece, in response to the measuring of the deformation of the workpiece.

The workpiece may include a semiconductor wafer, and the means for measuring deformation of the workpiece may include means for measuring deformation during thermal processing of the wafer.

The means for taking an action may include means for applying a deformation correction to a temperature measurement of the wafer during the thermal processing. The means for applying may include means for applying the deformation correction to a reflectivity measurement used to obtain the temperature measurement.

The means for taking an action may include means for modifying the thermal processing of the wafer.

The means for modifying may include means for initiating an irradiance flash incident upon a surface of the wafer in response to a measurement of a desired deformation of the wafer.

The means for modifying may include means for counteracting thermal runaway in the wafer. The means for modifying may include means for increasing a spacing between the wafer and a support plate therebeneath.

The means for modifying may include means for reducing a deformation of the wafer relative to its initial shape. The means for modifying may include means for supplying additional heat to a surface of the wafer. The means for modifying may include means for aborting the thermal processing of the wafer.

The means for measuring deformation may include means for measuring curvature of the wafer. The means for measuring curvature may include means for measuring a radius of curvature when the wafer has deformed to a dome shape.

The means for measuring curvature may include means for measuring a change in an image reflected by the wafer. For example, the means for measuring the change in the image may include means for measuring a change in a magnification of the image reflected by the wafer. The means for measuring the change in the image may include means for identifying at least two normals to a surface of the wafer.

The means for taking an action may include means for inducing a desired deformation of the wafer. The means for inducing may include means for causing the wafer to deform to a dome shape. The means for inducing may include means for causing the wafer to deform to a dome shape in which a center of the wafer is closer to an irradiance flash source than an outer perimeter of the wafer.

The means for causing may include means for irradiating a surface of the wafer to cause the surface to thermally expand. The means for causing may include means for selectively irradiating opposing surfaces of the wafer. The means for causing may include means for irradiating a wafer having at least one film-coated surface.

The apparatus may further include means for initiating an irradiance flash incident upon a surface of the wafer when the desired deformation of the wafer has been induced.

Also disclosed is a method of heat-treating a workpiece. The method includes pre-heating the workpiece to an intermediate temperature, and inducing a desired deformation of the workpiece before heating only a surface region of the workpiece to a desired temperature greater than the intermediate temperature within less than a thermal conduction time of the workpiece.

Also disclosed is an apparatus for heat-treating a workpiece. The apparatus includes a heating system and a processor circuit. The processor circuit is configured to control the heating system to pre-heat the workpiece to an intermediate temperature and to induce a desired deformation of the workpiece before heating only a surface region of the workpiece to a desired temperature greater than the intermediate temperature within less than a thermal conduction time of the workpiece.

Also disclosed is an apparatus for heat-treating a workpiece. The apparatus includes means for pre-heating the workpiece to an intermediate temperature, means for inducing a desired deformation of the workpiece and means for heating only a surface region of the workpiece to a desired temperature greater than the intermediate temperature within less than a thermal conduction time of the workpiece.

Other aspects and features of illustrative embodiments of the present invention will become apparent to those ordinarily skilled in the art upon review of the following description of such embodiments in conjunction with the accompanying figures.

BRIEF DESCRIPTION OF THE DRAWINGS

In drawings which illustrate embodiments of the invention.

DETAILED DESCRIPTION

Figure 1:
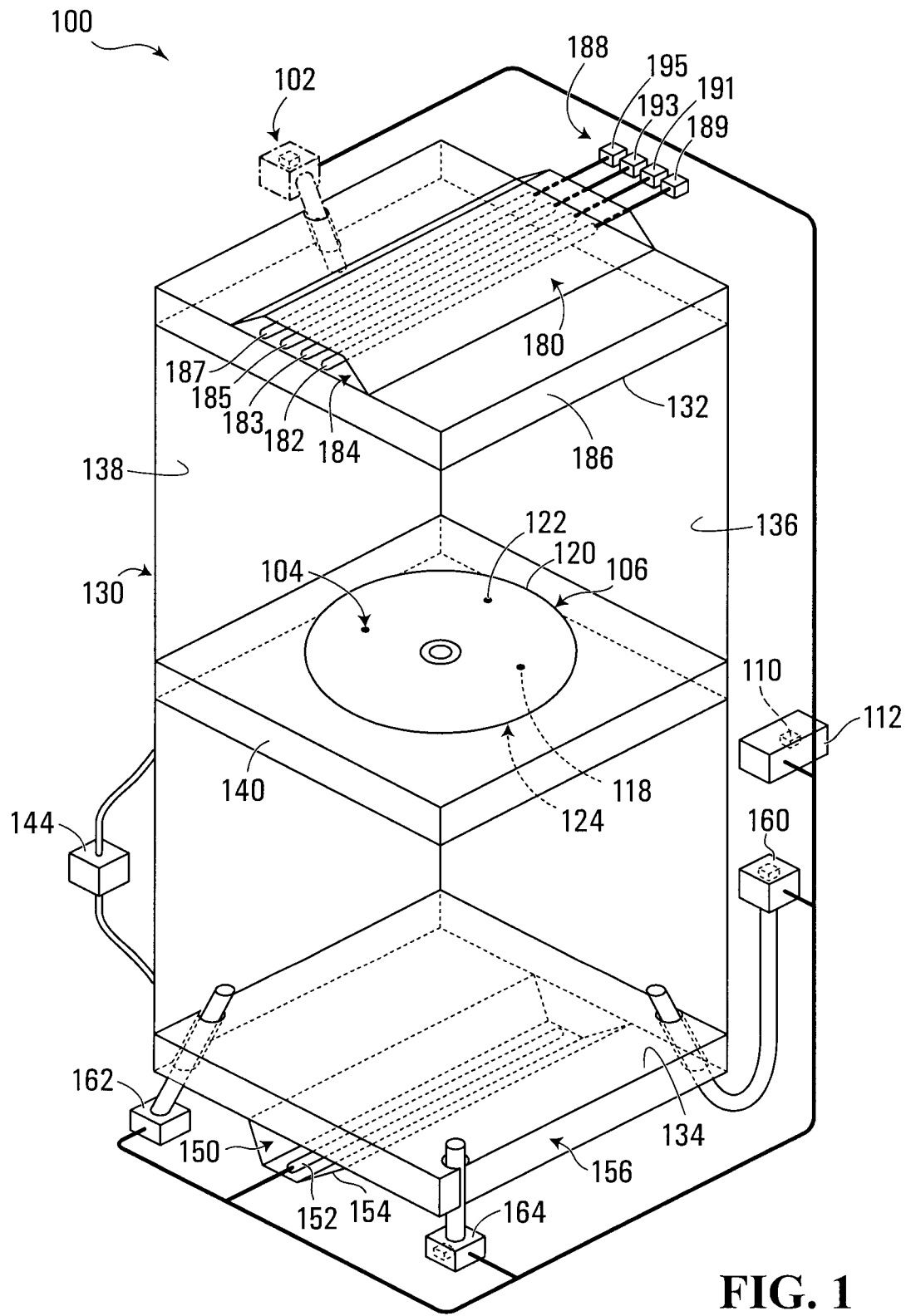
FIG. 1 is a perspective view of a rapid thermal processing (RTP) system according to a first embodiment of the invention, shown with two vertical front-side walls removed.

Referring to FIG. 1, an apparatus for heat-treating a workpiece according to a first embodiment of the invention is shown generally at 100. In this embodiment, the apparatus 100 includes a heat-treating system configured to heat-treat a workpiece 106, a measuring system configured to measure deformation of the workpiece during heat-treating of the workpiece by the heat-treating system, and a processor circuit 110. The processor circuit 110 is configured to cooperate with the heat-treating system and the measuring system to cause an action to be taken in relation to the heat-treating of the workpiece, in response to the measuring system measuring the deformation of the workpiece.

In this embodiment, the heat-treating system includes a backside heating system 150 and a topside heating system 180, described in greater detail below.

Also in this embodiment, the measuring system includes a plurality of measurement devices, such as those shown at 160, 162, 164 and 102, for example, described in greater detail below.

Workpiece

In this embodiment, the workpiece 106 includes a semiconductor wafer 120, and the heat-treating system includes a thermal processing system. More particularly, in this embodiment the wafer 120 is a 300 mm diameter silicon semiconductor wafer for use in the manufacture of semiconductor chips, such as microprocessors, for example. In the present embodiment, a first surface 104 of the workpiece 106 includes a topside or device side 122 of the wafer 120. Similarly, in this embodiment a second surface 118 of the workpiece includes a backside or substrate side 124 of the wafer 120.

In this embodiment, prior to the insertion of the wafer 120 into the apparatus 100, the device side 122 of the wafer is subjected to an ion implantation process, which introduces impurity atoms or dopants into a surface region of the device side of the wafer. The ion implantation process damages the crystal lattice structure of the surface region of the wafer, and leaves the implanted dopant atoms in interstitial sites where they are electrically inactive.

In order to move the dopant atoms into substitutional sites in the lattice to render them electrically active, and to repair the damage to the crystal lattice structure that occurs during ion implantation, the surface region of the device side of the wafer is annealed by heat-treating it as described herein.

Measuring System

In this embodiment, the measuring system of the apparatus 100 is configured to measure curvature of the wafer 120, or more particularly, to measure a radius of curvature when the wafer has deformed to a dome shape, as discussed in greater detail below.

In this embodiment, the measuring system of the apparatus 100 includes a plurality of measurement devices. More particularly, in this embodiment the measuring system includes an image source and a detector configured to detect a reflection of the image source by a surface of the wafer.

More particularly still, in this embodiment the image source includes a diagnostic illumination source 160, and the detector includes an imaging device 162 configured to detect a reflection of the diagnostic illumination source 160 by the backside surface 124 of the wafer 120. In this embodiment, the measuring system further includes a second detector, which in this embodiment is a fast radiometer 164.

In the present embodiment, except as otherwise stated herein, the diagnostic illumination source 160, the imaging device 162 and the fast radiometer 164 are constituted and arranged as described in greater detail in commonly owned U.S. Pat. No. 7,445,382, which is hereby incorporated herein by reference. Thus, in this embodiment the imaging device 162 includes a camera, which in this embodiment is an infrared camera operable to produce images of the backside 124 of the wafer 120. In the present embodiment, the infrared camera includes a diode array, or more particularly, a photodiode focal plane array. More particularly still, in this embodiment the infrared camera includes a 320×256 pixel Indium-Gallium-Arsenide (InGaAs) photodiode array, which has a 12-bit sensitivity. The camera also includes focussing optics (not shown), and further includes a narrow-band filter centered about 1450 nm, so that the camera is sensitive only to a diagnostic wavelength of 1450 nm and a very narrow bandwidth (e.g. ±15 nm) centered thereabout. Also in this embodiment, the diagnostic illumination source 160 includes a short-arc xenon arc lamp, operable to produce a diagnostic flash at the diagnostic wavelength of 1450 nm. In the present embodiment, the devices 160, 162 and 164 are all positioned so as to bypass the water-cooled window 156, so that the water-cooled window 156 does not filter illuminating radiation produced by the diagnostic illumination source 160, nor does it filter radiation received by the imaging device 162 or the fast radiometer 164. A synchronizer is also provided to synchronize the operation of the diagnostic illumination source 160 and the imaging device 162, as described in greater detail in U.S. Pat. No. 7,445,382. For conciseness, further details of the various components of the measuring system that are described in U.S. Pat. No. 7,445,382 are omitted herein.

Advantageously improving upon the measurement methods disclosed in U.S. Pat. No. 7,445,382, in the present embodiment, the diagnostic illumination source 160 and the imaging device 162 are used to measure deformation of the wafer 120 during heat-treating, and to generate a deformation correction to be applied to reflectivity measurements of the backside surface of the wafer obtained by the imaging device 162, as described in greater detail below.

In this embodiment, the location of the diagnostic illumination source 160 relative to the imaging device 162 has been changed slightly in comparison to their relative configuration as disclosed in U.S. Pat. No. 7,445,382. More particularly, in this embodiment the diagnostic illumination source 160 and the imaging device 162 are symmetrically located and angled such that an image of the diagnostic illumination source 160 is reflected to the imaging device 162 by a central region of the backside 124 of the wafer.

The measuring system of the apparatus 100 may further include a topside measurement system 102, which may be used for measuring a temperature of the device side 122 of the wafer 120, or for other purposes.

Alternatively, the topside measurement system 102 may be omitted from a given embodiment if desired.

Heat-Treating System

Generally, except as discussed herein, the apparatus 100 of the present embodiment is identical to the heat-treating apparatus described in commonly owned U.S. Patent Application Publication No. US 2007/0069161, which is incorporated herein by reference. Therefore, for conciseness, numerous details of the apparatus 100 disclosed in US 2007/0069161 are omitted.

As discussed in greater detail in US 2007/0069161, in this embodiment the apparatus 100 includes a chamber 130. The chamber 130 includes top and bottom selectively radiation-absorbing walls 132 and 134, which include selectively absorbing water-cooled windows 186 and 156, respectively. The chamber 130 also includes specularly reflective side walls, two of which are shown at 136 and 138 and the other two of which are removed for illustrative purposes. The workpiece 106 may be supported above a quartz window of an internal support plate 140 of the chamber 130, by a plurality of quartz pins (not shown), and may be lowered into and raised out of position for heat-treatment by a plurality of additional retractable pins (not shown). Alternatively, the workpiece may be supported by a workpiece support system (not shown) similar to that disclosed in U.S. Patent Application Publication No. US 2004/0178553, which is incorporated herein by reference, or by any other suitable means. A cooling system 144, which in this embodiment includes a circulated water cooling system, serves to cool the various surfaces of the chamber 130.

In the present embodiment, the heating system of the apparatus 100 includes the backside heating system 150 for heating the backside 124 of the wafer 120. The backside heating system 150 includes a high-intensity arc lamp 152 and a reflector system 154 disposed beneath the water-cooled window 156, as described in greater detail in US 2007/0069161.

As noted, further details of the apparatus 100 and its structural components and their functions, other than the novel functions and structural configurations described herein, may be found in US 2007/0069161.

In the present embodiment, the heating system of the apparatus 100 further includes the topside heating system 180. In this embodiment, the topside heating system 180 includes a flash lamp system. More particularly, in this embodiment the topside heating system 180 includes first, second, third and fourth flash lamps 182, 183, 185 and 187 and a reflector system 184, positioned immediately above the water-cooled window 186 of the chamber 130.

Alternatively, fewer than four flash lamps, such as a single flash lamp for example, may be employed. Conversely, more than four flash lamps, such as an array of a much larger number of flash lamps for example, may be employed.

In this embodiment, each of the flash lamps 182 includes a liquid-cooled flash lamp manufactured by Mattson Technology Canada, Inc. of Vancouver, Canada, similar to those described in commonly owned U.S. Patent Application Publication No. US 2005/0179354, which is incorporated herein by reference. In this regard, it has been found that this particular type of flash-lamp provides numerous advantages over more conventional flash-lamps, including improved consistency and repeatability of thermal processing, for example. Alternatively, other types of flash lamps may be substituted. More generally, other types of irradiance pulse generators, such as a microwave pulse generator or a pulsed or scanning laser for example, may be substituted for the flash lamps.

In addition, in this embodiment each of the flash lamps 182, 183, 185 and 187 is also configured to operate in a direct current, steady state mode, if desired. Thus, in addition to rapidly heating the device side 122 of the wafer 120 with one or more irradiance flashes, the flash lamps can also effectively act as DC arc lamps to continuously irradiate the device side (with considerably less power than during the flashes). Thus, in further alternative embodiments, other types of non-pulsed irradiance sources may supplement or may be substituted for one or more of the flash lamps.

In the present embodiment, the reflector system 184 is configured to uniformly irradiate the device side 122 of the wafer 120 when the two outer flash lamps, i.e. the first and fourth flash lamps 182 and 187, are fired simultaneously. In this embodiment, the reflector system 184 is also configured to uniformly irradiate the device side 122 of the wafer 120 when either of the two inner flash lamps, i.e. either the second flash lamp 183 or the third flash lamp 185, is fired in isolation. An example of such a reflector system is manufactured by Mattson Technology Canada, Inc. of Vancouver, Canada, as a component of their flash-assisted rapid thermal processing (fRTP™) system.

In the present embodiment, the topside heating system 180 further includes a power supply system 188 for supplying electrical power to the flash lamps 182, 183, 185 and 187 to produce the irradiance flash. In this embodiment, the power supply system 188 includes individual electrical power supply systems 189, 191, 193 and 195, for supplying electrical power to the individual flash lamps 182, 183, 185 and 187, respectively.

More particularly, in this embodiment each of the electrical power supply systems 189, 191, 193 and 195 of the power supply system 188 acts as a power supply system for a respective one of the flash lamps 182, 183, 185 and 187, and includes a pulsed discharge unit that may be pre-charged then abruptly discharged in order to supply a "spike" of input power to the respective flash lamp to produce the desired irradiance flash. More particularly still, in the present embodiment, each of the pulsed discharge units includes a pair of 7.9 mF capacitors (not shown) (15.8 mF per pulsed discharge unit), capable of being charged at 3500 V to store up to 96.775 kJ of electrical energy, and capable of discharging such stored energy to its respective flash lamp within a short period of time, such as 0.5 to 1.5 ms, for example. Thus, in this embodiment the topside heating system 180 is capable of storing up to 387.1 kJ of electrical energy, and is capable of discharging such energy through the flash lamps 182, 183, 185 and 187 in an irradiance pulse having a total duration less than a thermal conduction time of the workpiece 106. Alternatively, larger or smaller power supplies, or other types of power supplies, may be substituted.

If desired, each of the electrical power supply systems 189, 191, 193 and 195 may include a power control circuit in communication with the pulsed discharge unit and the respective flash lamp, for feedback control of the pulsed discharge that produces each irradiance flash. Alternatively, such power control circuits and feedback control may be omitted if they are not desired for a particular embodiment. Examples of power control circuits for providing such feedback control are described in commonly owned U.S. patent application publication no. US 2008/0273867, which is hereby incorporated herein by reference.

Further details of the individual electrical power supply systems 189, 191, 193 and 195, as well as details of such corresponding power control circuits, are disclosed in the above-mentioned US 2007/0069161.

RTP System Computer (RSC)

Figure 2:
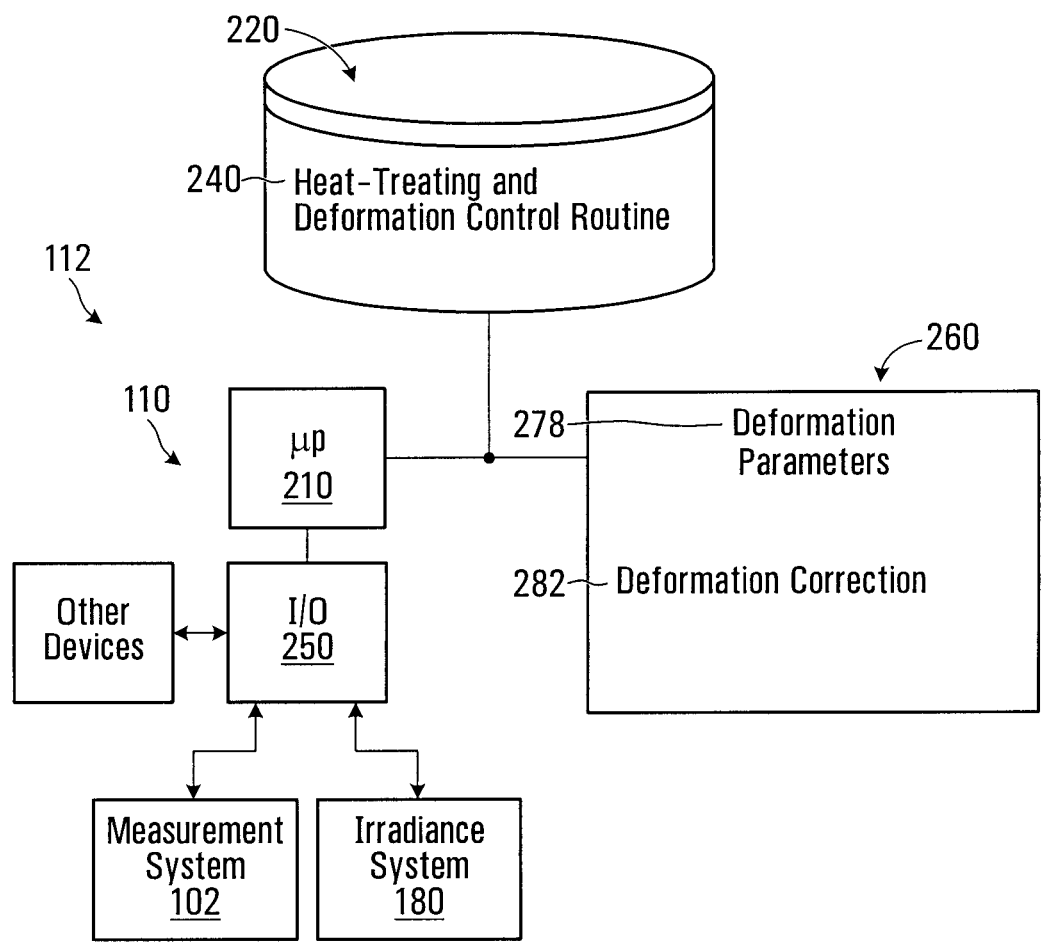
FIG. 2 is a block diagram of a rapid thermal processing system computer (RSC) of the system shown in FIG. 1.

Referring to FIGS. 1 and 2, the RTP System Computer (RSC) 112 is shown in greater detail in FIG. 2. In this embodiment, the RSC includes the processor circuit 110, which in the present embodiment includes a microprocessor 210. More generally, however, in this specification, the term "processor circuit" is intended to broadly encompass any type of device or combination of devices which the present specification and common general knowledge would enable the notional person of ordinary skill in the art to substitute for the microprocessor 210 to perform the functions described herein. Such devices may include (without limitation) other types of microprocessors, microcontrollers, other integrated circuits, other types of circuits or combinations of circuits, logic gates or gate arrays, or programmable devices of any sort, for example, either alone or in combination with other such devices located at the same location or remotely from each other, for example.

In the present embodiment, the microprocessor 210 is in communication with a storage device 220, which in this embodiment includes a hard disk drive. The storage device 220 is used to store one or more routines that configure or program the microprocessor 210 to cause various functions described herein to be performed. More particularly, in this embodiment the storage device 220 stores a heat-treating and deformation control routine 240, discussed in greater detail below. In this embodiment, the storage device 220 may also be used to store various types of data received or used by the microprocessor 210. If desired, the storage device 220 may also store additional routines and data for carrying out additional functions, such as any of the routines and data discussed in the above-mentioned commonly owned publication nos. US 2007/0069161 and US 2008/0273867, for example.

In the present embodiment, the microprocessor 210 is also in communication with a memory device 260, which in this embodiment includes a random access memory (RAM). In this embodiment, the various routines stored in the storage device 220 configure the microprocessor 210 to define various registers or stores in the RAM for storing various properties or parameters measured, calculated or used by the microprocessor 210, including a deformation parameters store 278 and a deformation correction register 282, as well as other stores and/or registers (not shown).

The microprocessor 210 of the present embodiment is in further communication with an input/output (I/O) interface 250, for communicating with various devices of the apparatus 100 shown in FIG. 1, including the topside measurement system 102 (if provided) and the topside heating system 180, as well as other system components such as the backside heating system 150, the diagnostic illumination source 160, the imaging device 162, the fast radiometer 164, and various user input/output devices (not shown) such as a keyboard, a mouse, a monitor, one or more disk drives such as a CD-RW drive and a floppy diskette drive, and a printer, for example. In this embodiment, the I/O interface 250 includes an optical-electrical converter, for communicating with at least some of these devices (such as the fast radiometer 164 and the topside measurement system 102, for example) via a fiber optic network (not shown), to avoid difficulties posed by electromagnetic interference and electrical noise resulting from large electric currents and sudden electrical discharges required by the backside heating system 150 and the topside heating system 180.

Operation

Heat-Treating and Deformation Control Routine

Figure 3:
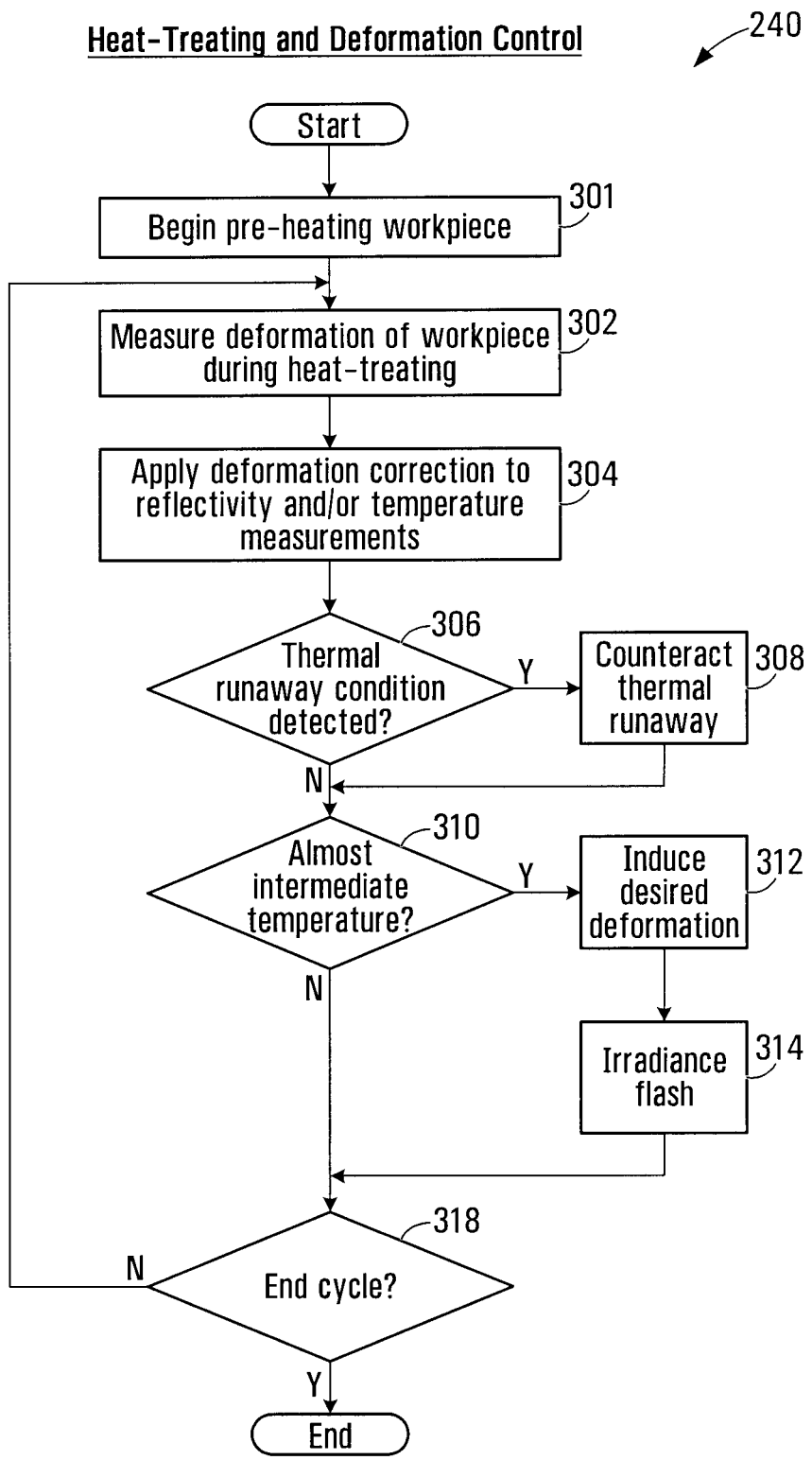
FIG. 3 is a flowchart of a heat-treating and deformation control routine executed by a processor circuit of the RSC shown in FIG. 2.

Referring to FIGS. 2 and 3, the heat-treating and deformation control routine is shown generally at 240 in FIG. 3.

In this embodiment, the heat-treating and deformation control routine 240 programs or configures the processor circuit 110 to control the heat-treating system to heat-treat the workpiece in a manner somewhat similar to that disclosed in commonly owned U.S. application publication no. US 2008/0273867, but modified to include workpiece deformation measurement, deformation control and related actions, as discussed in greater detail below. For conciseness and to permit a better understanding of the novel features of the present embodiment, the pre-heating and flash-heating portions of the heat-treating cycle are described concisely below, with numerous details of such heat-treating cycles as disclosed in commonly owned U.S. application publication no. US 2008/0273867 being omitted herein. Alternatively, the deformation measurement and control aspects of the present embodiment may be used in conjunction with other heat-treating cycles, such as those disclosed in commonly owned publication no. US 2007/0069161 or in commonly owned U.S. Pat. Nos. 6,594,446, 6,941,063, 6,963,692 and 7,445,382, to name but a few examples.

Generally, in this embodiment, the heat-treating and deformation control routine 240 configures the processor circuit 110 to control the measuring system to measure deformation of the workpiece during heat-treating of the workpiece by the heat-treating system. The heat-treating and deformation control routine 240 also configures the processor circuit 110 to cooperate with the heat-treating system and the measuring system to cause an action to be taken in relation to the heat-treating of the workpiece, in response to the measured deformation of the workpiece. As discussed in greater detail below, such actions may include the application of a deformation correction to reflectivity and/or temperature measurements that are obtained and used to control the heat-treating. Alternatively, or in addition, such actions may include more direct intervention, for example, by inducing a desired deformation of the wafer prior to commencement of the irradiance flash, by altering the spacing between the wafer and a support plate, or by aborting the heat-treating cycle.

In this embodiment, the heat-treating and deformation control routine 240 begins with a first block of codes 301, which directs the processor circuit 110 to control the heat-treating system to begin pre-heating the workpiece 106 to the intermediate temperature. More particularly, in this embodiment block 301 directs the processor circuit to control the backside heating system 150, to begin irradiating the backside or substrate side 124 of the wafer 120, to pre-heat the wafer to the intermediate temperature at a ramp rate that is slower than the thermal conduction time of the wafer (such as 150° C./sec, for example). In this embodiment, the topside heating system 180 is not used during the initial portion of the pre-heating stage, but is activated near the end of the pre-heating stage to induce a desired deformation of the workpiece prior to commencement of the irradiance flash, as discussed below in connection with block 312. Accordingly, during the initial portion of the pre-heating stage, a thermal gradient through the wafer exists, with the backside 124 being slightly hotter than the topside 122, thereby causing the wafer to deform into a "negative" curvature shape (opposite to a direction of curvature illustrated in FIG. 4). Advantageously, such a negative curvature shape tends to prevent thermal runaway during the pre-heating stage.

In this embodiment, a next block of codes 302 directs the processor circuit 110 to control the measuring system to measure deformation of the workpiece during heat-treating of the workpiece by the heat-treating system. More particularly, in this embodiment block 302 directs the processor circuit to control the measuring system to measure curvature of the wafer. More particularly still, in this embodiment block 302 directs the processor circuit to control the measuring system to measure a radius of curvature when the wafer has deformed to a dome shape.

Figure 4:
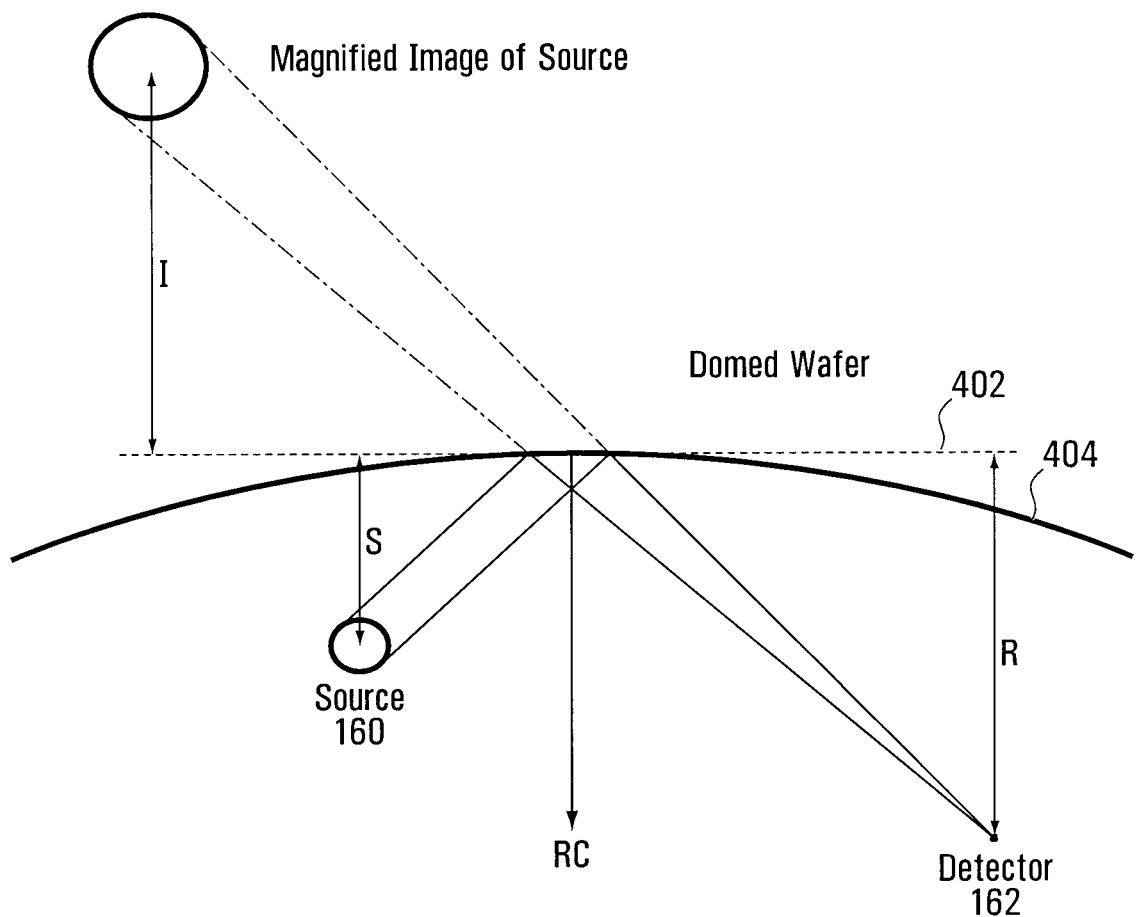
FIG. 4 shows an illustrative arrangement of an image source, a reflective semiconductor wafer, and a detector.

In this regard, referring to FIGS. 2, 3 and 4, the wafer 120 is illustrated in FIG. 4 in an initial planar disc shape 402, and in a subsequent thermally deformed dome shape 404 (which is not to scale, with deformations exaggerated for illustrative purposes). In the present embodiment, in which the workpiece is a 300 mm diameter silicon semiconductor wafer, if a temperature difference dT exists between the respective temperatures of the topside 122 and the backside 124, and the magnitude of the temperature difference dT is less than about 100° C., then such a temperature gradient tends to thermally deform the wafer 120 into a spherical dome shape. The wafer tends to relax to such a dome shape in approximately 100 ms (ten times its oscillation period). Provide the rate of change of the temperature difference dT is slow compared to this relaxation time, the wafer will tend to maintain a spherical dome shape having a radius of curvature RC. These conditions are typically satisfied during portions of rapid thermal processing cycles that involve pre-heating (preferably at less than about 250° C./s), soaking at constant temperatures or cooling, and thus, it can be assumed when such conditions are satisfied that a temperature gradient through the thickness of the wafer will thermally deform the wafer into a spherical dome shape. (These conditions would not be satisfied during the subsequent irradiance flash to heat the device side to the desired annealing temperature, as the rate of change of dT is much faster than the above-noted relaxation time, and the magnitude of the temperature difference dT is much greater than 100° C., so the assumption of a spherical dome shape is not valid during such rapid and intense adiabatic heating of the topside. Moreover, the modelling of the deformation of the wafer as a spherical dome shape is merely a convenient first-order approximation, which may be adequate for many (but not necessarily all possible) applications. In practice, depending upon the heat-treating cycle in question, the wafer may deform into a non-dome shape, such as a saddle shape where the curvature along two perpendicular lines of radius can be of opposite sign, for example. Alternatively, therefore, other more complicated variations of the present embodiment may be substituted, such as measuring deformation of the wafer at a plurality of locations rather than a single location, to provide a more accurate map of the deformed shape of the wafer.)

For illustrative purposes, the thermally deformed dome shape 404 shown in FIG. 4 has a "positive" curvature, with the central region of the wafer vertically elevated relative to the outer perimeter of the wafer, corresponding to a topside temperature that exceeds the backside temperature. In this embodiment, such a "positive curvature" shape corresponds to a desired deformation immediately preceding the irradiance flash. In this embodiment, this desired deformation is induced at the end of the pre-heating cycle, as discussed below in connection with block 312. Alternatively the wafer 120 may be curved in the "negative" direction with the central region of the wafer vertically lowered relative to the outer perimeter of the wafer, corresponding to a backside temperature that exceeds the topside temperature. In this embodiment, such "negative" curvature is induced during the initial portion of the pre-heating stage as discussed at block 301 above, during which only the backside 124 of the wafer is being irradiatively heated. Or, as a further alternative, such deformations of the wafer can be induced or arise through use of one or more films on the wafer having different coefficients of thermal expansion, or having different residual stresses when applied, without necessarily requiring a temperature gradient through the wafer.

In this embodiment, block 302 directs the processor circuit 110 to control the measuring system to measure the radius of curvature RC of the wafer 120 when it has deformed to a dome shape, such as the positive dome shape 404 or its negative dome shape mirror image, for example. More particularly, block 302 directs the processor circuit to control the measuring system to measure the radius of curvature by measuring a change in an image reflected by the wafer. More particularly still, block 302 directs the processor circuit to control the measuring system to measure a change in a magnification of an image reflected by the wafer.

In this regard, the radius of curvature RC is given by:

$$RC = D/(dT^*\alpha) \qquad (1)$$

where D is the wafer thickness, dT is the temperature difference between the topside and backside of the wafer and $\alpha$ is the coefficient of thermal expansion of the wafer. However, it is not desirable to rely upon the measured temperature difference dT to calculate the radius of curvature; rather, it is desirable to independently obtain the radius of curvature RC, in order to be able to calculate and apply a deformation correction to reflectivity measurements which are used to measure emissivity-compensated temperature values of the workpiece, as discussed below.

The magnification M, which is the ratio of the dimensions of the reflected image of the diagnostic illumination source 160 to its actual dimensions, is approximately given by:

$$M = \frac{1}{\left(\frac{2S}{RC} + 1\right)} \quad (2)$$

where S is the distance from the source to the central region of the backside 124 of the wafer.

In this embodiment, the magnification M is measured directly by the imaging source 162, by measuring the change in area of the reflected image of the diagnostic illumination source 160. More particularly, if the imaging device 162 observes the reflected image of the diagnostic illumination source 160 to have an initial area $A_0$ at time $t_0$ when the wafer 120 is in its initial planar shape 402, and observes the reflected image of the diagnostic illumination source 160 to have an area $A_n$ at a subsequent time $t_n$ when the wafer 120 is in its deformed dome shape 404, then the magnification $M_n$ may be estimated as:

$$M_n = \sqrt{\frac{A_n}{A_o}} \quad (3)$$

Accordingly, in this embodiment, each time block 302 is executed by the processor circuit 110, block 302 directs the processor circuit to control the imaging device 162 to measure the area A of the image of the diagnostic illumination source 160 reflected by the central region of the backside 124 of the wafer 120. The first such image area value $A_0$ corresponds to time $t_0$ at which the heat-treating cycle is commenced, at which time the wafer 120 is still in its initial planar shape 402, and block 302 directs the processor circuit 110 to stores the initial values ($A_0$, $t_0$) in the deformation parameters store 278 in the RAM 260 shown in FIG. 2. Subsequent measured image area values $A_n$ correspond to subsequent times $t_n$ during the heat-treating cycle.

Each image area value $A_0$, $A_n$ may represent a measurement of the area of a diagnostic flash produced by the diagnostic illumination source. Alternatively, if there is sufficient ambient illumination in the chamber for the camera to measure the area of the diagnostic illumination source when it is not activated, each image area value may be obtained when the diagnostic illumination source is not activated. Alternatively, other suitable areas or effective areas may be measured to determine the curvature of the wafer. For example, if desired, the diagnostic illumination source may be replaced with four continuous sources such as optical fibers, each projecting light toward the central region of the wafer, to project images of the four corners of a square onto the central region of the wafer for reflection to the camera. The magnification of the diagonals may then be measured with the camera to obtain an approximation of the area of the square. Alternatively, the deformation of the wafer may be measured in any other suitable way. One such alternative is discussed in greater detail below, following the end of the description of the heat-treating and deformation control routine.

In this embodiment, for each subsequent measurement of the reflected image area $A_n$, block 302 directs the processor circuit 110 to calculate a corresponding magnification value $M_n$ from equation (3) above, as well as a resulting radius of curvature RC from equation (2) above, i.e., $$RC_n = \frac{2S}{\left(\frac{1}{M_n} - 1\right)} = \frac{2SM_n}{(1 - M_n)} \quad (4)$$

Block 302 directs the processor circuit to store each such data set ($A_n$, $t_n$, $M_n$, $RC_n$) in the deformation parameters store 278 shown in FIG. 2. It will be appreciated that for a "positive dome" curvature as shown at 404 in FIG. 4, with the center of the wafer vertically elevated above the outer perimeter region of the wafer, $A_n > A_0$, $M_n > 1$, $RC_n < 0$ and $RC_n$ approaches negative infinity as $A_n$ approaches $A_0$, approaching a flat planar wafer shape. Conversely, for a "negative dome" curvature, with the center of the wafer vertically lowered below the outer perimeter region of the wafer, $A_n < A_0$, $0 < M_n < 1$, $RC_n > 0$ and $RC_n$ approaches positive infinity as $A_n$ approaches $A_0$, approaching a flat planar wafer shape. Thus, the sign of the stored curvature radius value $RC_n$ indicates the direction in which the wafer has deformed (negative value implying positive dome curvature and positive value implying negative dome curvature), and the magnitude of the stored curvature radius value $RC_n$ indicates the curvature of the dome (with very large values implying a virtually planar shape, and smaller values implying increasingly curved dome shapes).

Referring to FIGS. 3 and 4, following execution of block 302, block 304 then directs the processor circuit 110 to apply a deformation correction to a temperature measurement of the wafer during the thermal processing. More particularly, in this embodiment block 304 directs the processor circuit to apply the deformation correction to a reflectivity measurement used to obtain the temperature measurement.

In this regard, in general, a reflectivity measurement may be used to determine the emissivity of the wafer during heat-treating, in order to obtain an emissivity-compensated temperature measurement of the wafer. The reflectivity measurement may be obtained by measuring a ratio of detected radiation reflected by the wafer surface, to the intensity of the source radiation incident upon the surface. For example, one illustrative way of obtaining emissivity-compensated temperature measurements is disclosed in commonly owned U.S. Pat. No. 6,303,411, which is hereby incorporated herein by reference. Another more complicated method is disclosed in U.S. Pat. No. 7,445,382, in which the diagnostic illumination source 160 and the imaging device 162 are configured and synchronized to enable the imaging device 162 to measure a directional reflectivity of the backside 124 of the wafer 120, by measuring a reflection by the backside 124 of a diagnostic illumination flash produced by the diagnostic illumination source 160, at a diagnostic wavelength of 1450 nm. A scattering correction is then applied to the measured directional reflectivity measurement, to yield a reflectivity measurement of the backside 124, which is then used to produce an emissivity-compensated temperature measurement of the temperature of the backside 124.

In general, any such reflectivity measurement is susceptible to measurement errors if the shape of the reflecting backside surface 124 changes, from the initial planar shape 402 to the subsequent deformed dome shape 404, for example. More particularly, when the imaging device 162 observes a reflected image of the diagnostic illumination source 160, reflected by the central region of the backside 124 of the wafer, the amount of radiation detected by the imaging device for the reflected image is proportional to the solid angle subtended by the reflected image. As discussed above in connection with block 302, if at time $t_n$, the wafer 120 has deformed from its initial planar shape 402 into the deformed dome shape 404, the reflected image as received at the imaging device 162 is effectively magnified by a factor $M_n$. Accordingly, in this embodiment block 304 directs the processor circuit 110 to apply a deformation correction to the raw reflectivity measurement $R_{RAW_n}$, to obtain a corrected reflectivity value $R_{COR_n}$:

$$R_{COR_n} = \frac{R_{RAW_n}}{M_n^2} \quad (5)$$

The application of such a deformation correction to reflectivity measurements may be achieved in any suitable way. For example, in this embodiment, each time block 304 is executed, block 304 directs the processor circuit 110 to store an updated deformation correction value $1/M_n^2$ in the deformation correction register 282 in the RAM 260 shown in FIG. 2, corresponding to the present magnification $M_n$ associated with the present deformed shape of the wafer 120 at time $t_n$. In the present embodiment, in which the directional reflectivity $R_{WAF}$ of the backside 124 of the wafer is measured as disclosed in U.S. Pat. No. 7,445,382, the latter reflectivity measurement method is modified: in this embodiment, block 304 directs the processor circuit 110 to multiply the measured directional reflectivity value $R_{WAF}$ by the deformation correction value $1/M_n^2$ stored in the deformation correction register 282, to arrive at a deformation-corrected reflectivity value. A scattering correction is then applied to this deformation-corrected reflectivity value to obtain a final reflectivity value, which in turn is used to obtain an emissivity-compensated temperature measurement. Therefore, in this embodiment, the application of the deformation correction to the directional reflectivity value effectively amounts to an application of a deformation correction to a temperature measurement of the backside 124.

Figure 5:
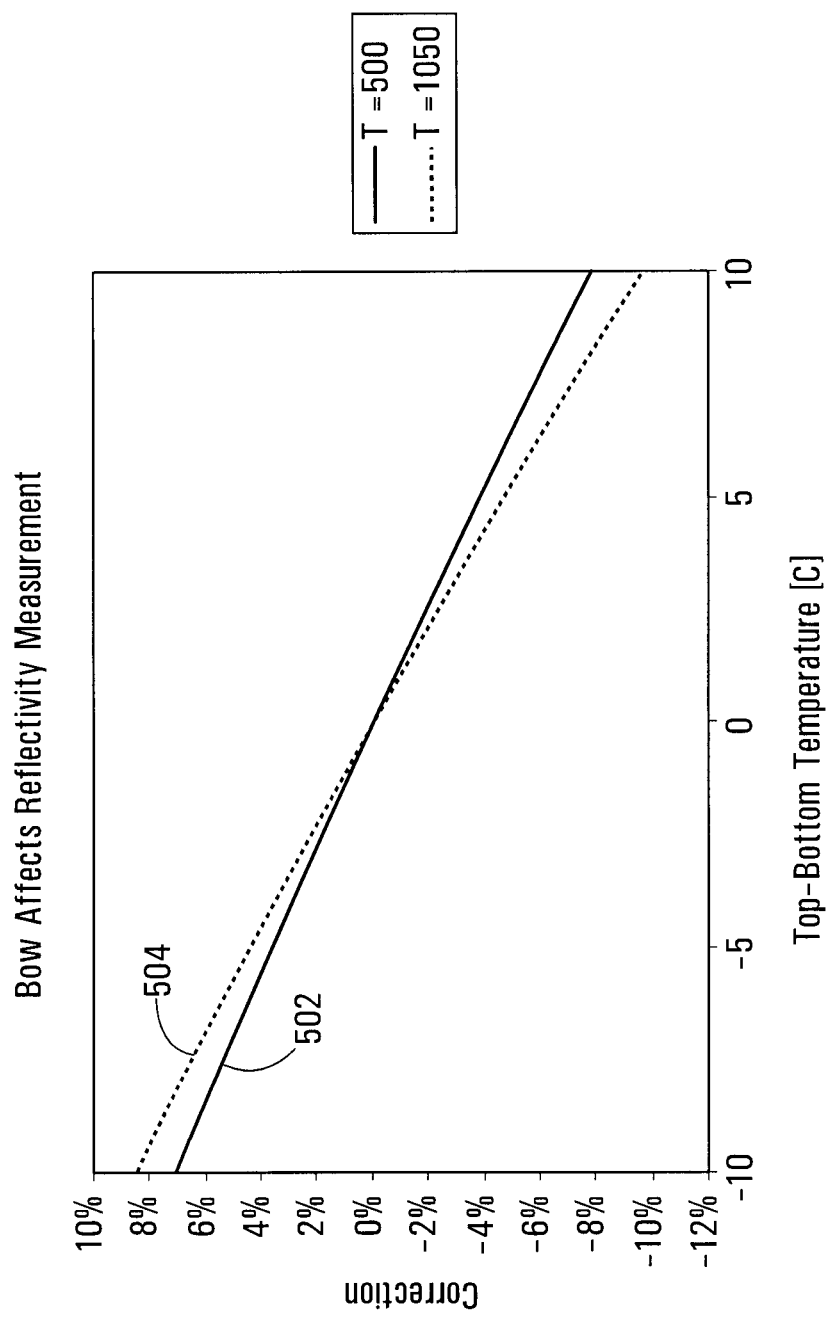
FIG. 5 is a graph of a percentage reflectivity measurement correction plotted against a difference between the device side and backside temperatures of a wafer, for two different illustrative wafer temperatures (T=500° C. and T=1050° C., the latter being the more steeply sloped curve)

Referring to FIGS. 2, 3 and 5, typical deformation corrections to be applied to reflectivity values are shown generally at 500 in FIG. 5. A first curve 502 plots reflectivity deformation corrections against topside-to-backside temperature differences for a wafer at 500° C., while a second curve 504 plots reflectivity deformation corrections against the same topside-to-backside temperature differences for a wafer at 1050° C. The two curves differ from each other due to the fact that the coefficient of thermal expansion of silicon varies with temperature. Both curves correspond to a wafer to which no films have been applied, so that thermal gradients through the wafer are the only cause of wafer deformation. Thus, as can be seen from the X- and Y-intercepts of both curves, when the topside-to-backside temperature difference is zero, no deformation correction is required to any reflectivity measurements, as the wafer would be planar in such a case. When the topside temperature exceeds the backside temperature (so that the topside temperature minus the backside temperature is greater than zero), such that the wafer is deformed into a "positive dome" shape as described herein, a negative reflectivity correction is applied, to compensate for the magnification of the reflected image of the diagnostic illumination source 160 as seen by the imaging device 162. Conversely, when the backside temperature exceeds the topside temperature, so that the wafer is deformed into a "negative dome" shape as described herein, a positive reflectivity correction is applied, to compensate for the diminished size of the reflected image of the diagnostic illumination source as seen by the imaging device. A comparison of the two curves indicates that for a given topside-to-backside temperature difference, the magnitude of the required correction is proportional to the average temperature of the wafer, indicating that a given top-to-bottom temperature differential will produce greater deformation curvature in a hotter wafer than in a cooler wafer.

Referring back to FIG. 3, in this embodiment, block 306 then directs the processor circuit 110 to determine whether a thermal runaway condition has been detected. To achieve this, in this embodiment block 306 directs the processor circuit 110 to examine the curvature radius value $RC_n$ that was most recently stored in the deformation parameters store 278 in the RAM 260. If the current wafer curvature radius value $RC_n$ is negative, indicating a "positive dome" curvature with the center of the wafer vertically elevated relative to the outer perimeter of the wafer, and has an absolute magnitude less than a predefined minimum radius threshold value $R_{MIN}$, indicating excessive curvature of the wafer, then a thermal runaway condition is deemed to have been detected.

As discussed in U.S. Pat. No. 7,501,607, for example, such a thermal runaway condition may occur if the wafer is pre-heated in a manner that the device side is excessively hotter than the backside of the wafer. In such a case, excessive thermal bowing would tend to occur in the "positive" direction as defined herein, with the central region of the wafer moving slightly upward and away from a support plate above which the wafer is supported, and the outer edges of the wafer moving closer to the support plate. Thermal conduction between the wafer and the support plate 140 above which it is supported is directly proportional to the temperature difference between the wafer and the support plate, and inversely proportional to the distance between them. In typical thermal processing, the wafer is hotter than the support plate throughout all except the very commencement and very end of the heat-treating cycle. In practice, the center of the support plate tends to be hotter than its edges, with the result that the temperature difference between the wafer and the support plate tends to be greater at the outer perimeter than at the center, which in turn promotes greater heat loss by the wafer at its outer regions in comparison to its center. As the outer edges of the backside of the wafer move closer to the support plate under such thermal bowing, the rate of conduction of heat from the outer edges of the backside 124 to the support plate 140 increases, with the result that the temperature difference between the device side and the back-side becomes even greater, causing further aggravation of the thermal bowing effect. In addition, the outer edges tend to shrink as they cool relative to the remainder of the wafer, which in turn forces the hot expanded center of the wafer to thermally bow even further. Thus, the more the wafer bows, the greater the conduction from the edges of the wafer to the support plate, which in turn causes further bowing and even greater conductive heat losses at the edges. In this scenario, thermal runaway can occur, and may result in undesirably large temperature non-uniformities in the wafer. These non-uniformities may damage or even break the wafer, depending on their magnitude. In addition to the pre-heating stage, such thermal coupling and thermal runaway effects may also occur during a subsequent cooling stage following an irradiance flash.

Accordingly, block 306 directs the processor circuit 110 to determine whether a thermal runaway condition has been detected, by determining whether the most recently stored wafer curvature radius value $RC_n$ is negative and has an absolute magnitude less than the predefined minimum threshold radius value, as discussed above. In this embodiment, the predefined minimum radius threshold value is $R_{MIN}$=6.2 m; in this regard, for a 300 mm diameter wafer, a curvature of −6.2 m corresponds to a positive dome shape with the center of the wafer elevated approximately 1 mm above its edges. Alternatively, other suitable thresholds may be substituted. In the present embodiment, during the initial portion of the pre-heating cycle as described above at block 301, during which only the backside heating system 150 is actively heating the wafer, it is expected that the resulting temperature gradient will cause the wafer curvature radius value $RC_n$ to be positive, indicating a "negative dome" curvature with the center of the wafer vertically lower than its outer perimeter, in which case block 306 will not detect a thermal runaway condition. However, if one or more films have been placed on the backside, the topside or both, it is possible that a "positive dome" curvature may still result, even during the initial portion of the pre-heating stage, potentially giving rise to thermal runaway if not detected at block 306 and corrected at block 308 below. Likewise, in other embodiments in which the wafer is pre-heated partially or entirely by irradiating the topside 122, such "positive dome" shapes or negative curvatures may easily result during the pre-heating stage, potentially giving rise to thermal runaway unless detected and corrected at blocks 306 and 308.

Alternatively, other criteria may be used to identify a thermal runaway condition. For example, if it is expected that the true shape of the wafer may differ significantly from the first-order approximation of a dome shape in a particular embodiment, such as a saddle shape for example, a plurality of deformation measurements may be obtained for a plurality of respective measurement points on the backside 124 of the wafer, and a thermal runaway condition may be identified if any of the outer edge regions of the wafer are closer to the support plate than the center of the wafer by more than a threshold difference.

In this embodiment, if a thermal runaway condition is detected at block 306, then block 308 directs the processor circuit to control the heat-treating system to modify the thermal processing of the wafer 120 in response to the measured deformation of the wafer. More particularly, block 308 directs the processor circuit to control the heat-treating system to counteract thermal runaway in the wafer.

To achieve this, in the present embodiment block 308 directs the processor circuit to control the heat-treating system to supply additional heat to a surface of the wafer. More particularly, in this embodiment block 308 directs the processor circuit 110 to control the heat-treating system to selectively irradiate opposing surfaces of the wafer 120. More particularly still, in this embodiment block 308 directs the processor circuit to increase the power of the irradiance being supplied by the backside heating system 150 to the backside 124 of the wafer, while commensurately decreasing the power of the irradiance being supplied by the topside heating system 180 to the topside 122 of the wafer. This tends to increase the thermal expansion of the backside 124 of the wafer 120 while decreasing the thermal expansion of the topside 122, thereby reducing the overall "positive dome" curvature of the wafer 120 and countering the thermal runaway effect.

Alternatively, block 308 may direct the processor circuit 110 to control the heating system to counteract thermal runaway in other ways. For example, in one alternative embodiment, a modified block 308 directs the processor circuit 110 to control the heat-treating system to increase a spacing between the wafer 120 and the support plate 140 above which the wafer is supported. To achieve this, the modified block 308 directs the processor circuit to cause retractable loading pins (not shown) to be extended upward from the support plate 140, thereby raising the wafer 120 higher above the support plate. This reduces the thermal coupling effects between the wafer and the support plate, which in turn diminishes the thermal runaway effect. Modified block 308 then directs the processor circuit to control the heat-treating system to continue the thermal processing cycle, with the wafer spaced further above the support plate. As a further example, in another alternative embodiment, a modified block 308 directs the processor circuit 110 to control the heat-treating system to abort the thermal processing of the wafer 120, by shutting down the backside and topside heating systems 150 and 180 and extending the retractable loading pins to raise the wafer up and away from the support plate 140. Or, as a further alternative, two or more of these countermeasures may be combined in a single embodiment. For example, if the absolute magnitude of the radius of curvature of the wafer $RC_n$ is less than a first predefined threshold $R_{T1}$, but is greater than a second predefined threshold $R_{T2}$, block 308 may direct the processor circuit to selectively adjust the irradiance powers incident upon the backside and topside as described above, to reduce the deformation that the wafer has experienced relative to its initial shape; and if the wafer curvature radius $RC_n$ is less than the second predefined threshold $R_{T2}$, block 308 may direct the processor circuit to abort the thermal processing cycle as described above.

Following execution of block 306 (and if applicable block 308), in this embodiment blocks 310 to 314 effectively direct the processor circuit 110 to induce a desired deformation of the wafer, and to control the heat-treating system to initiate an irradiance flash incident upon a surface of the wafer in response to the measuring system measuring the desired deformation of the wafer.

In this embodiment, block 310 first directs the processor circuit 110 to monitor temperature measurement signals received from the fast radiometer 164 to determine whether the wafer 120 has almost reached a desired intermediate temperature, after which the irradiance flash is to be initiated. More particularly, in this embodiment block 310 directs the processor circuit to determine whether the wafer 120 is within a predefined time interval preceding its arrival at the desired intermediate temperature. More particularly still, in this embodiment block 310 directs the processor circuit to determine whether the wafer 120 is within less than $4 \times 10^{-1}$ seconds from arriving at the intermediate temperature. In this embodiment, this is achieved by directing the processor circuit to consider the desired intermediate temperature, the present temperature of the wafer, and the present ramp rate at which the wafer is being heated. For example, if the wafer is being heated to a desired intermediate temperature of 700° C. at a ramp rate of 150° C./sec, the processor circuit would determine that the wafer is within 0.4 seconds of arriving at the desired intermediate temperature when the wafer reaches a temperature of 640° C. In this embodiment, the 0.4 second interval preceding the arrival at the intermediate temperature is selected to be sufficiently long to allow the heating system to cause the wafer to change its shape to a desired pre-flash deformation (which can typically be achieved in about 0.1 seconds, for example), yet sufficiently short that there is insufficient time for the desired pre-flash deformation to cause thermal runaway (which is typically negligible in time periods shorter than about one second). Advantageously, therefore, the present embodiment permits a "positive dome" shape to be induced immediately before an irradiance flash, thereby reducing the likelihood that the flash may damage or break the wafer, while at the same time avoiding the potential thermal runaway effects that may have resulted if the wafer had been in such a "positive dome" shape during the entire pre-heating stage.

Following a determination at block 310 that the wafer has almost reached the desired intermediate temperature, block 312 then directs the processor circuit 110 to induce a desired pre-flash deformation, and to determine whether the wafer 120 is deformed into the desired pre-flash deformation.

More particularly, to induce the desired pre-flash deformation in the present embodiment, block 312 directs the processor circuit 110 to control the heating system, to activate the topside heating system 180 to begin continuously irradiating the topside 122 of the wafer, while simultaneously reducing the power with which the backside heating system 150 is irradiating the backside 124 of the wafer. More particularly, in this embodiment block 312 directs the processor circuit to reduce the power supplied to the backside irradiance system 150 by more than half, and to begin supplying an equivalent amount of power to the topside heating system 180 to operate the flash lamps in a continuous (DC) arc lamp mode, thereby maintaining the total (topside+backside) irradiance power approximately constant, thus maintaining the average temperature ramp rate constant. This tends to reverse the temperature gradient through the wafer, causing the temperature of the topside 122 to exceed that of the backside 124, thereby causing the wafer to deform into a "positive dome" shape (negative RC), with the center of the wafer closer to the topside heating system 180 than the outer perimeter of the wafer.

In this embodiment, to determine whether the wafer 120 is presently deformed into the desired pre-flash deformation, block 312 directs the processor circuit 110 to measure and store a new wafer curvature radius value $RC_n$ in the deformation parameters store 278, in the same manner as described above at block 302. In this embodiment, the desired pre-flash deformation is a "positive dome" curvature of the wafer 120, with the center of the wafer vertically elevated above the outer perimeter of the wafer. Accordingly, in this embodiment, the wafer 120 is identified as being in the desired pre-flash deformation if two criteria are met: (1) the current value of the wafer curvature radius value $RC_n$ for the current time $t_n$ must be negative (i.e., $RC_n<0$), indicating the desired "positive dome" curvature; and (2) the absolute magnitude of the current value of the wafer curvature radius value $RC_n$ must be less than or equal to a predefined maximum radius threshold $R_{MAX}$, indicating a minimum curvature of the wafer. More particularly, in this embodiment the maximum radius threshold $R_{MAX}$ is 10 meters; in other words, in this embodiment the desired pre-flash deformation is a positive dome shape corresponding to a surface segment of a sphere having a radius of 10 meters or less. Alternatively, however, different criteria may be applied to determine if the workpiece is presently deformed into a different desired shape. For example, if the desired shape is "planar", the sign of curvature may be disregarded and the criterion may simply require the absolute magnitude of the radius of curvature to exceed a predefined large value, corresponding to an approximately planar shape within acceptable error bars. As a further example, if the desired shape is simply "positively domed", the criterion may disregard the magnitude of the radius of curvature and simply require that the radius of curvature be negative.

If it is determined at block 312 that the wafer 120 does not conform to the desired deformed shape, then block 312 directs the processor circuit to control the heat-treating system to induce the desired deformation of the wafer. Thus, if at block 312 it was determined that either (1) the sign of the current wafer curvature radius value $RC_n$ is positive, indicating a "negative dome" curvature of the wafer, or (2) the sign of the current $RC_n$ value is negative indicating a "positive dome" curvature of the wafer but the magnitude of $RC_n$ is greater than the predefined maximum radius threshold value $R_{MAX}$, indicating insufficient curvature of the wafer, then block 312 directs the processor circuit to control the heat-treating system to cause the wafer 120 to deform to the desired deformation.

To achieve this, block 312 directs the processor circuit 110 to control the heat-treating system to further increase the amount of irradiant power being supplied to the topside 122 of the wafer by the topside heating system 180 (operating in a continuous discharge or DC mode), and to commensurately reduce the amount of irradiant power being supplied to the backside 124 of the wafer by the backside heating system 150. If desired, the magnitude of the topside power increase may be proportional to the deviation from the desired shape, with a maximum topside power increase corresponding to an incorrect (positive) sign of the current wafer curvature radius value $RC_n$ indicating curvature in the wrong direction (negative dome). If the curvature $RC_n$ of the wafer is in the correct direction (positive dome) but its magnitude exceeds the predefined maximum radius threshold value $R_{MAX}$, comparatively smaller topside power increases, proportional to the difference between the magnitude of $RC_n$ and $R_{MAX}$, may be provided. Alternatively, the topside power increase and backside power decrease may be predetermined or fixed values.

In this embodiment, block 312 also directs the processor circuit 110 to continue to measure the wafer curvature, and to continue to generate new data values ($A_n$, $t_n$, $M_n$, $RC_n$) and new deformation correction values and store such values in the deformation parameters store 278 and the deformation correction store 282, in the same way as described above at blocks 302 and 304. While the wafer is undergoing modified heat-treating to induce the desired deformation as a result of the execution of block 312, block 312 directs the processor circuit to examine each new successive wafer curvature value $RC_n$, and to determine whether it satisfies the same two criteria described above corresponding to the desired deformation of the wafer.

Alternatively, in some embodiments the desired deformation of the wafer 120 may be induced without the need for substantial irradiance of the topside 122. For example, by providing a film on either the topside 122 or the backside 124 of the wafer, or by providing different films on the topside and the backside, the topside 122 (or film thereon) can have a greater coefficient of thermal expansion (CTE) than the backside 124, so that the topside will thermally expand to a greater extent than the backside even if the backside is slightly hotter than the topside as a result of having pre-heated the wafer by irradiating only or primarily the backside. In such embodiments therefore, the initial topside irradiance step to induce the desired shape may be omitted, and may be performed only if a measurement of the deformation of the wafer indicates that the wafer is not presently in the desired deformed shape.

Immediately upon detecting a present wafer curvature radius value $RC_n$ that satisfies the above two criteria, indicating that the desired deformation of the wafer 120 has been induced, the processor circuit is directed to block 314, to initiate an irradiance flash incident upon a surface of the wafer 120. To achieve this, in this embodiment block 314 directs the processor circuit 110 to control the topside heating system 180 to produce an irradiance flash incident upon the topside 122 of the wafer, in generally the same manner as described in commonly owned U.S. Pat. Nos. 6,594,446, 6,941,063, 6,963,692 and 7,501,607, or Publication No. US 2008/0273867, for example. In this embodiment, block 314 also directs the processor circuit to deactivate the backside heating system 150, although alternatively, if desired, the backside heating system 150 may continue to irradiate the backside 124 of the wafer at low power during and after the flash. Thus, in this embodiment, block 314 directs the processor circuit to control the heat-treating system to expose the topside 122 of the wafer 120 to an irradiance flash, to heat the topside 122 to a desired annealing temperature greater than the intermediate temperature. The irradiance flash has a duration shorter than the thermal conduction time of the workpiece, such as a full-width at half-maximum (FWHM) of about 2 milliseconds, for example, so that the flash heats only the topside surface region of the wafer to the desired annealing temperature, while the bulk of the workpiece remains close to the intermediate temperature. The bulk of the workpiece then acts as a heat sink to rapidly cool the topside of the wafer following the irradiance flash. In this embodiment, block 314 further directs the processor circuit to obtain a plurality of real-time temperature measurements of the topside 122 of the wafer during the irradiance flash, and to use such measurements for real-time feedback control of the irradiance flash, as described in greater detail in commonly owned U.S. patent application publication no. US 2008/0273867. Alternatively, other forms of real-time feedback control of the irradiance flash may be substituted, such as the methods disclosed in U.S. Pat. No. 7,501,607, for example. Alternatively, real-time measurement and feedback control during the flash may be omitted if desired.

In this embodiment, following execution of block 310 or block 314, block 318 directs the processor circuit 110 to determine whether the thermal processing cycle to which the wafer is being subjected has ended. In this embodiment, block 318 directs the processor circuit to control the measurement system to measure the workpiece temperature, to determine whether it has sufficiently cooled following execution of the flash at block 314. If the wafer has not yet sufficiently cooled, the processor circuit is directed back to blocks 302 to 308, to continue measuring the deformation of the wafer during heat-treating, and to counteract any thermal runaway that may occur during the cooling cycle, as described above, until such time as the wafer has sufficiently cooled, at which point the heat-treating and deformation control routine 240 is ended. Alternatively, block 318 may be omitted and the heat-treating and deformation control routine 240 may be ended immediately following completion of the irradiance flash at block 314, if desired.

Other Illustrative Alternatives

Although the foregoing describes an illustrative method of measuring deformation of a workpiece during heat-treating, alternatively, other methods of measuring such deformation may be substituted.

For example, in an alternative embodiment, the measuring system is configured to measure deformation of the wafer 120 by identifying at least two normals to a surface of the wafer.

More particularly, in such an alternative embodiment, the following illustrative methodology may be employed by a modified block 302.

In this embodiment, the backside 124 of the wafer 120 is reflective and so behaves like a simple mirror. If the wafer deforms, any reflected image from the wafer will become distorted. The distorted reflected image has a relationship to the form or shape of the deformed reflective surface.

In general, attempting to estimate the form or shape of a reflective surface from the reflected image of a scene is an ill-posed problem, as there are an infinite number of reflective surface shapes that can produce the same reflected image given a suitably formed scene [1]. This problem may be overcome by imposing a suitable set of constraints. Two such constraints include using a known scene and a calibrated camera. A known scene refers to a scene having objects of known dimensions and locations, and a calibrated camera refers to a camera with known parameters, such as its focal length, location and viewing orientation. Additional constraints are also described below.

In the following description, vectors are denoted using bold-faced lower-case letters, while matrices are denoted using bold upper-case letters, and scalars are denoted by non-bold letters. Points and differences in points are expressed as vectors, such as:

$$w = \begin{bmatrix} w_1 \\ w_2 \\ \vdots \\ w_{N-1} \\ w_N \end{bmatrix} = [w_1, w_2, \ldots, w_{N-1}, w_N]^T, \quad (6)$$

In the above general example, the vector w is a column vector having N elements, and can be conveniently denoted in text by use of the transpose operator T. In this embodiment, however, points and vectors represent locations in three-dimensional space, and therefore, N=3. Thus, a point in three-dimensional space having Cartesian coordinates x, y and z may be represented as $w=[x, y, z]^T$.

The length of a vector is given by the $l_2$-norm distance metric that is denoted by the operator $\|\cdot\|$. The inner and cross product of two vectors are denoted by the operators $\langle \cdot, \cdot \rangle$, and $\otimes$, respectively.

In this embodiment, the deformation of the surface of the wafer 120 is estimated using a reflective region of the wafer. Highly reflective regions include the backside 124 and certain portions of the topside 122 surface. Less reflective regions can also be viewed but present an increased effort to view any reflected image. In this embodiment, a known scene is projected onto the regions of the wafer that will be reflecting an image to the camera.

Figure 6:
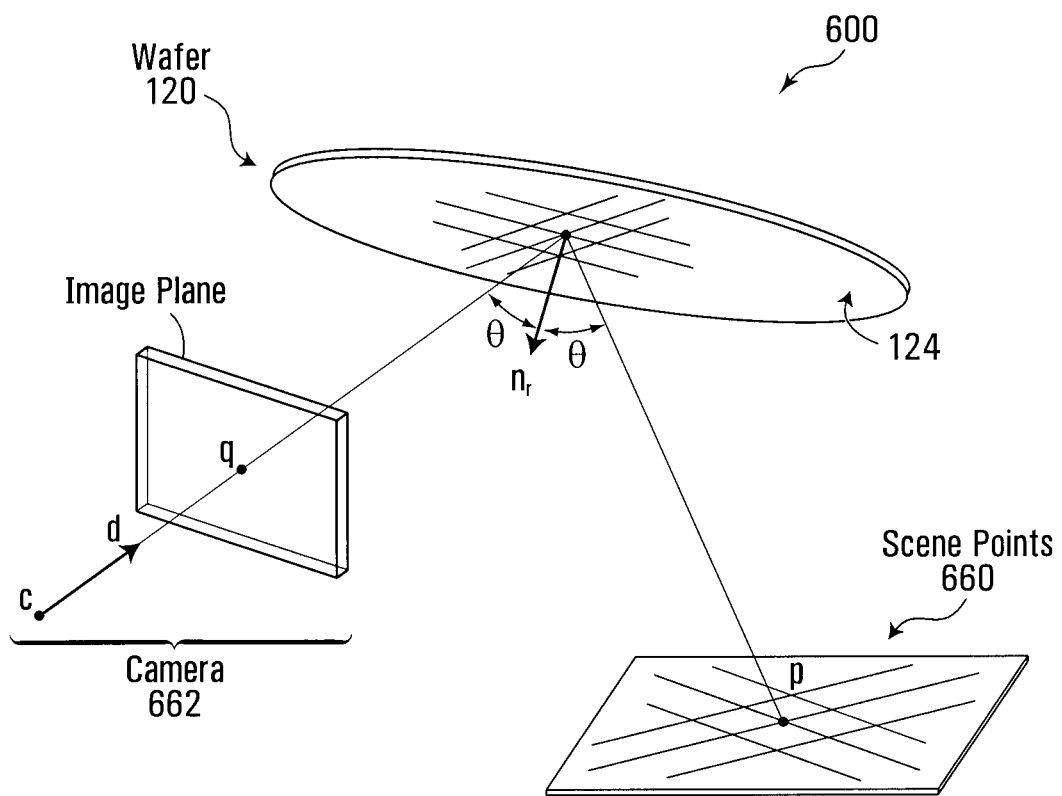
FIG. 6 shows another illustrative arrangement of a known scene image source, a reflective semiconductor wafer and a camera.

Referring to FIG. 6, an illustrative measuring configuration is shown generally at 600 in FIG. 6. In this embodiment, the backside 124 of the wafer 120 is used to reflect a known scene consisting of grid lines in a plane. The known scene is projected onto the backside 124 of the wafer using an illumination source 660. The intersections of the grid lines of the known scene form points that represent known locations of the scene. A camera 662 is represented abstractly as a pin hole camera with a focal point or center of projection at point c and an imaging plane that is typically the camera's sensing element. The imaging plane is shown in front of the camera's focal point for mathematical convenience.

FIG. 6 also introduces the notation and geometry of the problem. The known scene point p, representing the intersection of two grid lines, is reflected off the backside 124 of the wafer 120 at point r and is imaged by the camera 662 at point q. The unit vector d is directed along the line formed by points c and r. The unit vector $n_r$ represents the normal of the surface of the wafer at point r and the angle θ represents the reflection angle.

In general, for any particular camera view there will be a set of M scene points, $P=[p_1, p_2, \ldots, p_M]$, that will be reflected from the backside 124 of the wafer and viewed by the camera 662. The physical location of the scene points and resolution of the camera will determine the accuracy and resolution of the estimate of the surface deformation of the wafer. The use of regularly spaced scene points on a grid, as suggested in FIG. 6, is only one possible placement strategy that is mathematically convenient.

The surface deformation of the wafer 120 can, in most cases, be estimated from a given set of reflection points that are viewed by the camera 662. To achieve this in the present embodiment, at each viewed reflection point the surface normal is determined so as to obtain the location of each reflection point r, the direction of the surface normal $n_r$, and the reflection angle θ. This set of surface normals then allows an estimate of the surface of the wafer to be formed using any number of known methods of surface reconstruction.

In this embodiment, to estimate the surface normals, additional constraints are imposed. To appreciate these constraints, the relationship between the surface normal and a single parameter is derived. It is this parameter that will be constrained so as to enable estimation of the surface normals. The notion of expressing the surface normal in terms of such a single parameter was introduced by Saverese [1]-[5].

As noted previously, the constraint of a calibrated camera implies that the location of c and the perpendicular distance between c and the image plane are known. Specifically, this distance represents the camera focal length and is denoted f. The image point q is given by the intersection of the line defined by c and r and the image plane. The location of point q can be measured directly by identifying the location of q in the image taken by the camera. The constraint of having a known scene implies that the location of p is known. Therefore, the unknowns are the point r, vector $n_r$, and angle θ. Without additional constraints, the position of r is unknown, except that it must be located on the line formed by c and q. To describe this situation more precisely, the position of r can be expressed as:

$$r = c + sd \tag{7}$$

where $d = (q-c)/\|q-c\|$ is the unit vector parallel to the line given by q and c, and $s = \|r-c\|$ represents the unknown distance between r and c. In this embodiment, it is this single parameter s that is constrained, to enable a determination of the surface normal.

Still referring to FIG. 6, in this embodiment, c, p, and r define a plane, referred to herein as the principal plane. The unit normal vector to the principal plane is denoted $n_p$ and can be obtained to point in the desired direction using:

$$n_p = \frac{(p-c)}{(p-c)} \otimes \frac{(q-c)}{\|(q-c)\|}, \tag{8}$$

$$= \frac{(p-c)}{\|(p-c)\|} \otimes d.$$

The vectors given by r–p and r–c represent an incident and reflected ray, respectively. Therefore, specular geometry dictates the condition that the surface at r have a unit normal vector $n_r$ that bisects the angle, 2θ, formed by the incident and reflected rays. In addition, specular geometry dictates the condition that $n_r$ must lie in the principal plane formed by the incident and reflected rays. The former condition implies that the angle between $n_r$ and the incident ray equals the angle between $n_r$ and the reflected ray, that is:

$$\left\langle n_r, \frac{r-p}{\|r-p\|} \right\rangle = \left\langle n_r, \frac{r-c}{\|r-c\|} \right\rangle,$$

Noting that $(r-c)/\|r-c\| = d$, yields, $$\left\langle n_r, \frac{r-p}{\|r-p\|} \right\rangle = \langle n_r, d \rangle, \tag{9}$$

or $$\left\langle n_r, d - \frac{r-p}{\|r-p\|} \right\rangle = 0.$$

The latter condition of requiring $n_r$ to lie in the principal plane, can be expressed as:

$$\langle n_r, n_p \rangle = 0, \tag{10}$$

Using Equation (9) and Equation (10), the surface normal vector at r can be expressed as a function of the known points, c, q, and p and the unknown distance parameter s. To detail the derivation of this expression, note that the vector given by (r–p)=(r–c)–(p–c)=sd–(p–c). Next, consider unit vectors representing the direction of the incident and reflected rays. The difference between these unit vectors is a vector that is perpendicular to the normal vector $n_r$. The cross product of this difference vector and normal to the principal plane, $n_p$, is $n_r$, that is, $$n_r = \left( d - \frac{r-p}{\|sd-(p-c)\|} \right) \otimes n_p, \tag{11}$$

The elimination of r and the expression of Equation (11) in terms of the known points and the unknown parameter s, begins by using r–p=sd–(p–c), that is, $$n_r = \left( \frac{d\|sd-(p-c)\| + p - c - sd}{\|sd-(p-c)\|} \right) \otimes n_p, \tag{12}$$

$$= \left( \frac{(p-c) - (s - \|p-c-sd\|)d}{\|p-c-sd\|} \right) \otimes n_p,$$

where $$\|sd-(p-c)\| = \|(p-c)-sd\|$$

is used to maintain consistency with [1].

To express the reflection angle θ in terms of the known points and the unknown parameter s, recall that the angle between the unit vectors representing the reflected and incident rays is 2θ and can be expressed using:

$$\cos 2\theta = 2\cos^2 \theta - 1 = \left\langle d, \frac{r-p}{\|r-p\|} \right\rangle, \tag{13}$$

$$= \left\langle d, \frac{sd-(p-c)}{\|sd-(p-c)\|} \right\rangle$$

$$= \left\langle d, \frac{sd+c-p}{\|sd+c-p\|} \right\rangle$$

$$= \frac{1}{\|sd+c-p\|} \langle d, sd+c-p \rangle$$

$$= \frac{1}{\|sd+c-p\|} (\langle d, sd \rangle - \langle d, p-c \rangle),$$

$$= \frac{1}{\|sd+c-p\|} (s\langle d, d \rangle - \langle d, p-c \rangle),$$

$$= \frac{1}{\|sd+c-p\|} (s - \langle d, p-c \rangle),$$

$$\cos\theta = \frac{1}{\sqrt{2}} \sqrt{\frac{s - \langle d, p-c \rangle}{\|sd+c-p\|} + 1}.$$

Equation (12) and Equation (13) form the basis by which the surface normal at r can be estimated. If there is no physical constraint on the reflective surface of the wafer, it would not be possible to determine s from a single set of known points c, q, and p.

As proven in [5], if in addition to the single image point q and scene point p associated with r, the orientation, or direction, of at least three curves that pass through q, and correspondingly p, can be determined, it is possible to determine the surface normal at r. These curves can be approximated by a spline that passes through three image points that includes q, and correspondingly p, which then allows the direction of the tangent at q, and correspondingly at p, to be determined.

Though the method given in [1]-[5] provides a means to estimate a surface normal, the illustrative measurement configuration shown in FIG. 6 has a number of distinct differences from the configurations described in [1]-[5]. These differences advantageously allow another means to estimate the surface normal.

One particular important difference is that the distance s is already known for a perfectly flat wafer so that the surface normal can be estimated using Equations (7), (12), and (13). In this regard, although real wafers are not perfectly flat, the extent of their actual warpage and bow is typically less than a hundred or so micrometers. This distance is small relative to s, which can be on the order of hundreds of millimeters. For example, let $s_f$, $n_{rf}$, and $\theta_f$ represent the true distance, normal, and angle, respectively, of a flat wafer at any particular reflection point. The deviation, $\Delta s$, from $s_f$ is typically less than one part in one thousand, that is, $(\Delta s/s) < 1 \times 10^{-3}$. In other words, only those reflection points that are a distance $s_f$ from c will have correct estimates for $n_{rf}$ and $\theta_f$. The other reflection points will have surface normal estimates that have a small error associated with them.

The small errors in the surface normal estimates can be viewed as noise in the estimates from a surface that varies smoothly. A number of surface reconstruction methods that are robust to noise in the normal estimates can be applied to estimate a surface [6], [7]. Given that the actual wafer surface varies smoothly, surface reconstruction estimates can be obtained for a surface with a smoothness that can be set to be consistent with the expected wafer deformations. These surface estimates can then be used to obtain another estimate for s at each reflection point and the surface normals can be re-estimated using Equations (7), (12), and (13). Again, another surface can be obtained and compared to the last surface. This process can be repeated until the surface estimates do not change by more than a predefined or user-defined value.

In this embodiment, another difference between the illustrative measurement configuration shown in FIG. 6 in comparison with those described in [1]-[5], is that in the present embodiment, another image of the wafer is obtained a short time interval later. This time interval is set to be short enough, on the order of 20 μsec., that the change in the deforming wafer is again small. This allows the surface and normal estimates from the previous instance to be used as initial estimates for the next instance. In this way, surface and normal estimates are always obtained from small deviations from a known set of values.

A further difference is that the scene points in [1]-[5] are viewed simultaneously with the reflected image, whereas in FIG. 6, the scene points are not directly in the camera view. This does not present a difficulty for the present embodiment, since the tool holding the wafer and the scene is well controlled and has known dimensional characteristics allowing the location of the scene points to be highly accurate.

In this embodiment, it is assumed that the position of the scene points, resolution of the camera, and the image quality allow distinguishing changes in the surface normal estimates.

Having obtained a set of surface normal estimates as described above, it is possible to approximate the deformed backside surface 124 of the wafer 120 over a small region containing only two normals, using a spherical model. This allows a simpler estimate of the wafer curvature over any small region.

Figure 7:
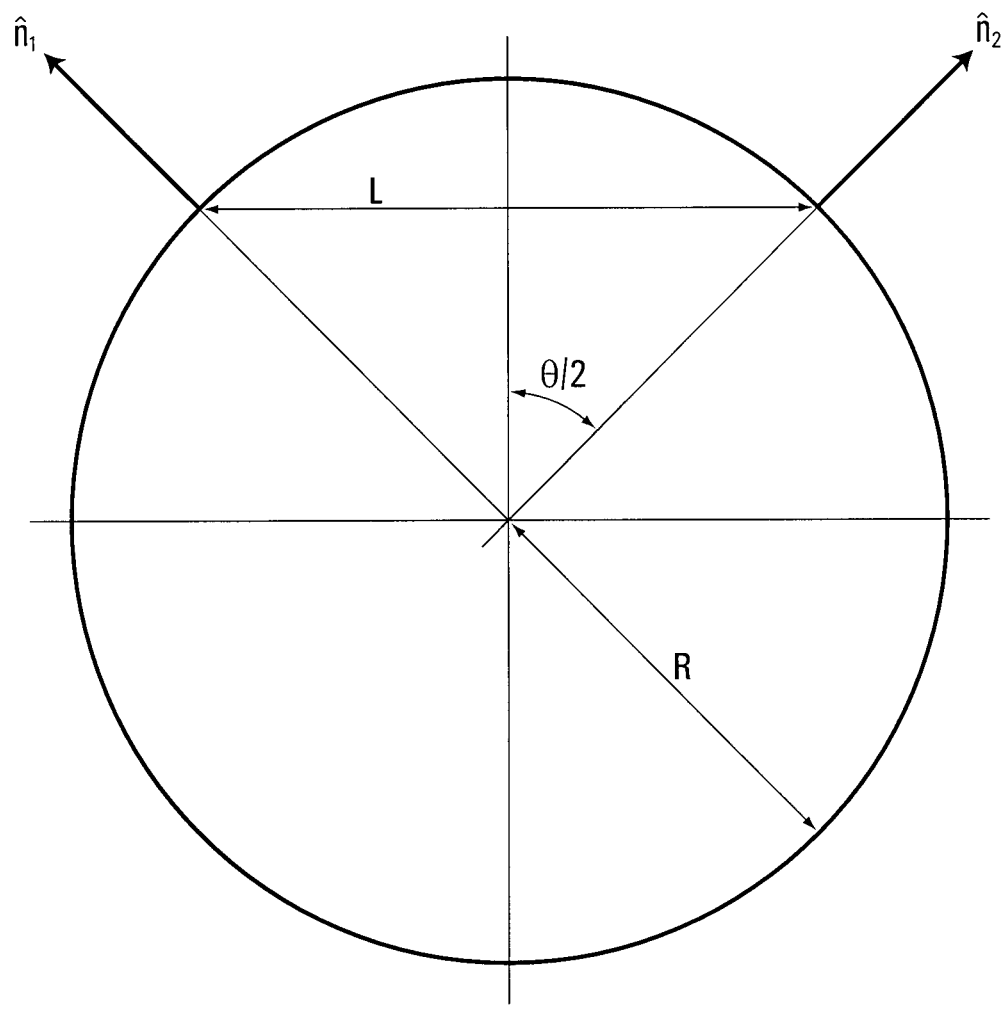
FIG. 7 illustrates two normals to a spherical surface.

Accordingly, referring to FIGS. 6 and 7, in the present embodiment, the curvature of the backside surface 124 is determined using the direction and position of two surface normals and an assumption of the form of the surface between the normals. In the case of two surface normals on a spherical surface, FIG. 7 illustrates unit normals, $\hat{n}_1$ and $\hat{n}_2$, spaced a distance L from each other on a spherical surface having a radius R. The angle between the two normals can be determined using the dot product, that is:

$$\|\hat{n}_1\|\|\hat{n}_2\| \cos\theta = <\hat{n}_1, \hat{n}_2>,$$

$$\cos\theta = <\hat{n}_1, \hat{n}_2>,$$

$$\theta = \cos^{-1}(<\hat{n}_1, \hat{n}_2>), \quad (14)$$

where $\cos^{-1}$ denotes the arccosine operator. Using elementary geometry, the distance L is given by:

$$L = 2R \sin(\theta/2), \quad (15)$$

which then allows the radius, or radius of curvature, to be given by:

$$R = \frac{L}{2\sin(\theta/2)}. \quad (16)$$

By definition, curvature κ is the inverse of the radius of curvature, or:

$$\kappa = \frac{1}{R} = \frac{2\sin(\theta/2)}{L}, \quad (17)$$
$$= \frac{2\sin(\cos^{-1}(<\hat{n}_1, \hat{n}_2>)/2)}{L}.$$

Accordingly, in this embodiment, a wafer curvature radius value RC may be obtained as R from equation (16), and the corresponding curvature may be obtained from equation (17), as described above.

More generally, other suitable ways of measuring the deformation of the wafer 120 may be substituted. More generally still, while specific embodiments of the invention have been described and illustrated, such embodiments should be considered illustrative of the invention only and not as limiting the invention as construed in accordance with the accompanying claims.

REFERENCES

[1] Silvio Savarese, Min Chen, and Pietro Perona, "Local shape from mirror reflections", International Journal of Computer Vision, vol. 64, no. 1, pp. 31-67, 2005.

[2] S. Savarese and P. Perona, "Local analysis for 3D reconstruction of specular surfaces", in Proc. of IEEE Conference on Computer Vision and Pattern Recognition, Kawa'i, USA, December 2001.

[3] S. Savarese and P. Perona, "Local analysis for 3D reconstruction of specular surfaces—part II", in Proc. of European Conference of Computer Vision, Denmark, May 2002.

[4] M. Chen S. Savarese and P. Perona, "Recovering local shape of a mirror surface from reflection of a regular grid", in Proc. of European Conference of Computer Vision, Prague, May 2004.

[5] Silvio Savarese, Shape Reconstruction from Shadows and Reflections, Ph.d. thesis, electrical engineering, CalTech, Pasadena, Calif., 2005.

[6] Peter Kovesi, "Shapelets correlated with surface normals produce surfaces", in 10th IEEE International Conference on Computer Vision, Beijing, 2005, pp. 994-1001.

[7] Robert T. Frankot and Rama Chellappa, "A method for enforcing integrability in shape from shading", IEEE Transactions on Pattern Analysis and Machine Intelligence, vol. 10, no. 4, pp. 439-451, July 1998.

What is claimed is:

1. A method comprising:
   a) measuring deformation of a semiconductor workpiece during heat-treating thereof, wherein the semiconductor workpiece comprises a semiconductor wafer, wherein the heat-treating comprises heating the semiconductor wafer, and wherein measuring the deformation comprises measuring a curvature of the semiconductor wafer during the heating of the semiconductor wafer;
   b) obtaining a temperature measurement of the semiconductor wafer during the heat-treating thereof by detecting electromagnetic radiation from the semiconductor wafer, wherein the temperature measurement is affected by a deformation error resulting from magnification of the electromagnetic radiation caused by the curvature of the semiconductor wafer; and
   c) taking an action in relation to the heating of the semiconductor wafer, in response to the measuring of the deformation of the semiconductor wafer, wherein taking the action comprises compensating for the deformation error resulting from the magnification by applying a deformation correction to the temperature measurement of the semiconductor wafer during the heating.

2. The method of claim 1 wherein applying the deformation correction comprises applying the deformation correction to a reflectivity measurement used to obtain the temperature measurement.

3. The method of claim 1 wherein taking the action further comprises modifying the heating of the semiconductor wafer.

4. The method of claim 3 wherein modifying the heating comprises initiating an irradiance flash incident upon a surface of the semiconductor wafer in response to measuring a desired deformation of the semiconductor wafer.

5. The method of claim 3 wherein modifying the heating comprises counteracting thermal runaway in the semiconductor wafer.

6. The method of claim 3 wherein modifying the heating comprises increasing a spacing between the semiconductor wafer and a support plate therebeneath.

7. The method of claim 3 wherein modifying the heating comprises reducing a deformation of the semiconductor wafer relative to its initial shape.

8. The method of claim 3 wherein modifying the heating comprises supplying additional heat to a surface of the semiconductor wafer.

9. The method of claim 3 wherein modifying the heating comprises aborting the heating of the semiconductor wafer.

10. The method of claim 1 wherein measuring the curvature comprises measuring a radius of curvature when the semiconductor wafer has deformed to a dome shape.

11. The method of claim 1 wherein measuring the curvature comprises measuring a change in an image reflected by the semiconductor wafer.

12. The method of claim 11 wherein measuring the change in the image comprises measuring a change in a magnification of the image reflected by the semiconductor wafer.

13. The method of claim 11 wherein measuring the change in the image comprises identifying at least two normals to a surface of the semiconductor wafer.

14. The method of claim 1 wherein taking the action further comprises inducing a desired deformation of the semiconductor wafer.

15. The method of claim 14 wherein inducing the desired deformation comprises causing the semiconductor wafer to deform to a dome shape.

16. The method of claim 15 wherein causing the semiconductor wafer to deform comprises irradiating a surface of the semiconductor wafer to cause the surface to thermally expand.

17. The method of claim 15 wherein causing the semiconductor wafer to deform comprises selectively irradiating opposing surfaces of the semiconductor wafer.

18. The method of claim 15 wherein the semiconductor wafer has at least one film-coated surface and wherein causing the semiconductor wafer to deform comprises irradiating the semiconductor wafer.

19. The method of claim 14 wherein inducing the desired deformation comprises causing the semiconductor wafer to deform to a dome shape in which a center of the semiconductor wafer is closer to an irradiance flash source than an outer perimeter of the semiconductor wafer.

20. The method of claim 14 further comprising initiating an irradiance flash incident upon a surface of the semiconductor wafer when the desired deformation of the semiconductor wafer has been induced.

21. The method of claim 1 wherein measuring the curvature comprises measuring a radius of curvature of the semiconductor wafer at a plurality of locations on a surface of the semiconductor wafer.

22. An apparatus comprising:
   a) means for measuring deformation of a semiconductor workpiece during heat-treating thereof, wherein the semiconductor workpiece comprises a semiconductor wafer, wherein the heat-treating comprises heating the semiconductor wafer, and wherein the means for measuring the deformation comprises means for measuring a curvature of the semiconductor wafer during the heating of the semiconductor wafer;
   b) means for obtaining, during the heat-treating of the semiconductor wafer, a temperature measurement of the semiconductor wafer that is affected by a deformation error, the means for obtaining comprising means for detecting, from the semiconductor wafer, electromagnetic radiation that is affected by magnification caused by the curvature of the semiconductor wafer, the deformation error of the temperature measurement resulting from the magnification; and
   c) means for taking an action in relation to the heating of the semiconductor wafer, in response to the measuring of the deformation of the semiconductor wafer, wherein the means for taking the action comprises means for compensating for the deformation error resulting from the magnification by applying a deformation correction to the temperature measurement of the semiconductor wafer during the heating.

23. The apparatus of claim 22 wherein the means for applying the deformation correction comprises means for applying the deformation correction to a reflectivity measurement used to obtain the temperature measurement.

24. The apparatus of claim 22 wherein the means for taking the action further comprises means for modifying the heating of the semiconductor wafer.

25. The apparatus of claim 24 wherein the means for modifying the heating comprises means for initiating an irradiance flash incident upon a surface of the semiconductor wafer in response to a measurement of a desired deformation of the semiconductor wafer.

26. The apparatus of claim 24 wherein the means for modifying the heating comprises means for counteracting thermal runaway in the semiconductor wafer.

27. The apparatus of claim 24 wherein the means for modifying the heating comprises means for increasing a spacing between the semiconductor wafer and a support plate thereeneath.

28. The apparatus of claim 24 wherein the means for modifying the heating comprises means for reducing a deformation of the semiconductor wafer relative to its initial shape.

29. The apparatus of claim 24 wherein the means for modifying the heating comprises means for supplying additional heat to a surface of the semiconductor wafer.

30. The apparatus of claim 24 wherein the means for modifying the heating comprises means for aborting the heating of the semiconductor wafer.

31. The apparatus of claim 22 wherein the means for measuring the curvature comprises means for measuring a radius of curvature when the semiconductor wafer has deformed to a dome shape.

32. The apparatus of claim 22 wherein the means for measuring the curvature comprises means for measuring a change in an image reflected by the semiconductor wafer.

33. The apparatus of claim 32 wherein the means for measuring the change in the image comprises means for measuring a change in a magnification of the image reflected by the semiconductor wafer.

34. The apparatus of claim 32 wherein the means for measuring the change in the image comprises means for identifying at least two normals to a surface of the semiconductor wafer.

35. The apparatus of claim 22 wherein the means for taking the action further comprises means for inducing a desired deformation of the semiconductor wafer.

36. The apparatus of claim 35 wherein the means for inducing the desired deformation comprises means for causing the semiconductor wafer to deform to a dome shape.

37. The apparatus of claim 36 wherein the means for causing the semiconductor wafer to deform comprises means for irradiating a surface of the semiconductor wafer to cause the surface to thermally expand.

38. The apparatus of claim 36 wherein the means for causing the semiconductor wafer to deform comprises means for selectively irradiating opposing surfaces of the semiconductor wafer.

39. The apparatus of claim 36 wherein the semiconductor wafer has at least one film-coated surface and wherein the means for causing the semiconductor wafer to deform comprises means for irradiating the semiconductor wafer.

40. The apparatus of claim 35 wherein the means for inducing the desired deformation comprises means for causing the semiconductor wafer to deform to a dome shape in which a center of the semiconductor wafer is closer to an irradiance flash source than an outer perimeter of the semiconductor wafer.

41. The apparatus of claim 35 further comprising means for initiating an irradiance flash incident upon a surface of the semiconductor wafer when the desired deformation of the semiconductor wafer has been induced.

42. The apparatus of claim 22 wherein the means for measuring the curvature comprises means for measuring a radius of curvature of the semiconductor wafer at a plurality of locations on a surface of the semiconductor wafer.

43. The apparatus of claim 22 wherein the means for detecting electromagnetic radiation that is affected by magnification comprises an imaging device.

44. The apparatus of claim 43 wherein the imaging device comprises a photodiode array.

45. The apparatus of claim 43 wherein the means for measuring deformation comprises the imaging device, an image source and a processor circuit in communication with the imaging device and with the image source, wherein the imaging device and the image source are located and angled such that an image of the image source is reflected to the imaging device by a surface of the semiconductor wafer.

46. The apparatus of claim 45 wherein the image source comprises a diagnostic illumination source.

47. The apparatus of claim 45 wherein the means for compensating for the deformation error comprises the processor circuit in communication with the imaging device.

* * * * *